United States Patent
Ferber, Jr.

(10) Patent No.: US 8,691,422 B2
(45) Date of Patent: Apr. 8, 2014

(54) MODULAR INTERCONNECTION SYSTEM

(71) Applicant: Electronvault, Inc., Woodside, CA (US)

(72) Inventor: Robert R. Ferber, Jr., Woodside, CA (US)

(73) Assignee: Electronvault, Inc., Woodside, CA (US)

( * ) Notice: Subject to any disclaimer, the term of this patent is extended or adjusted under 35 U.S.C. 154(b) by 0 days.

(21) Appl. No.: 13/688,089

(22) Filed: Nov. 28, 2012

(65) Prior Publication Data

US 2013/0089990 A1    Apr. 11, 2013

Related U.S. Application Data

(63) Continuation of application No. 12/724,388, filed on Mar. 15, 2010, now Pat. No. 8,361,646.

(51) Int. Cl.
*H01M 2/24* (2006.01)

(52) U.S. Cl.
USPC ............................. 429/158; 429/160; 439/38

(58) Field of Classification Search
USPC ................. 429/158–160; 439/38, 39
See application file for complete search history.

(56) References Cited

U.S. PATENT DOCUMENTS

| | | | | |
|---|---|---|---|---|
| 6,217,339 B1 * | 4/2001 | Tsubata | .......................... | 439/38 |
| 7,923,144 B2 * | 4/2011 | Kohn et al. | .................... | 429/170 |
| 7,935,438 B2 * | 5/2011 | Kim | ............................... | 429/160 |
| 8,025,996 B2 * | 9/2011 | Nedelec | ......................... | 429/158 |
| 8,062,785 B2 * | 11/2011 | Kishii et al. | ................... | 429/159 |

* cited by examiner

*Primary Examiner* — Hien Vu
(74) *Attorney, Agent, or Firm* — Alston & Bird LLP

(57) ABSTRACT

A modular interconnection system in the form of a releasable modular interconnect is provided. The releasable modular interconnect may include a substrate with a plurality of releasable contact regions, where each releasable contact region may be positioned to overlay a respective terminal of a power cell. The releasable modular interconnect may also include at least one conductive interconnect member affixed to the substrate, where the conductive interconnect member includes at least a one conductive releasable contact disposed within a releasable contact region of the substrate. The conductive releasable contact may be positioned to form a releasable electrical connection with a terminal of a power cell when a force is applied to the first releasable contact region in a direction toward the terminal of the power cell. Additional and related methods and apparatuses are also provided.

27 Claims, 21 Drawing Sheets

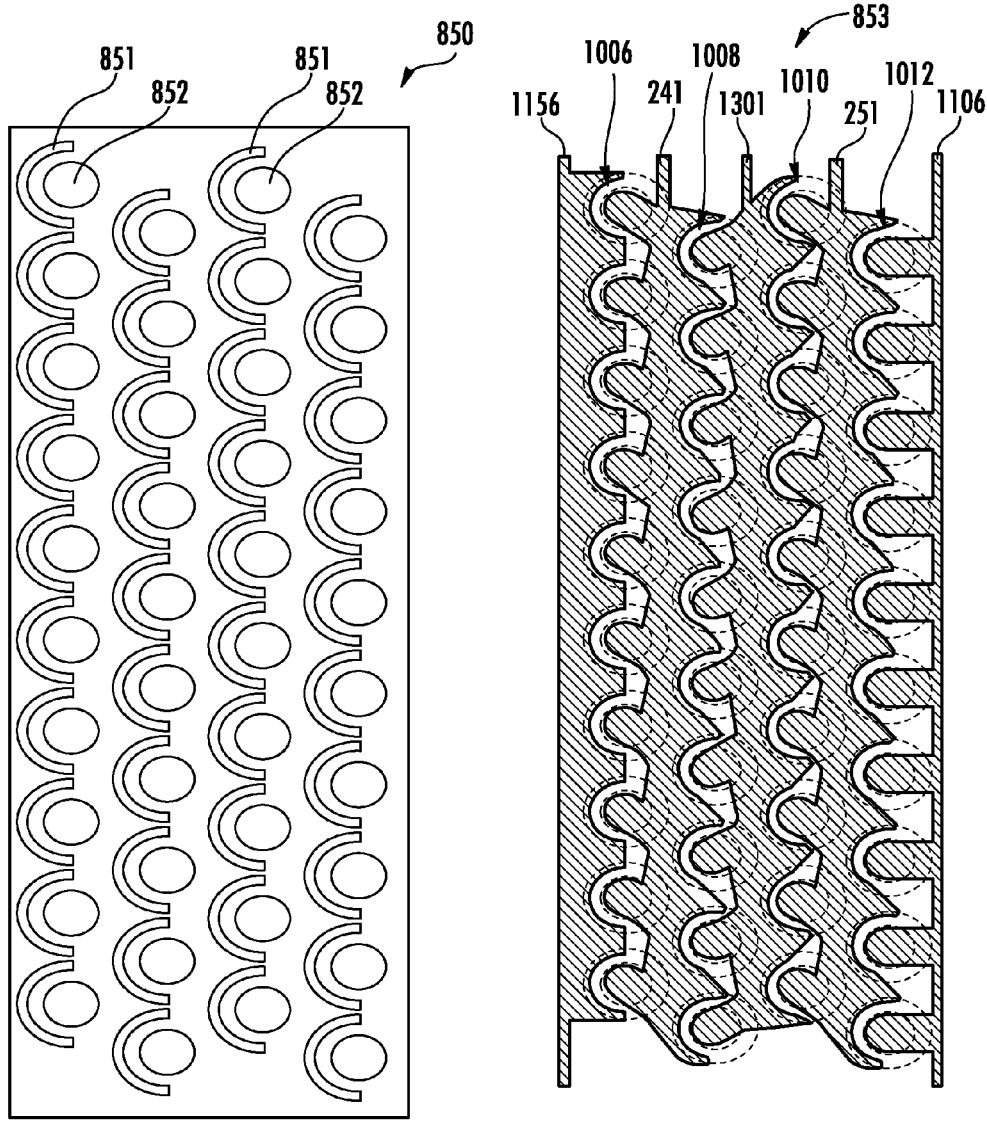

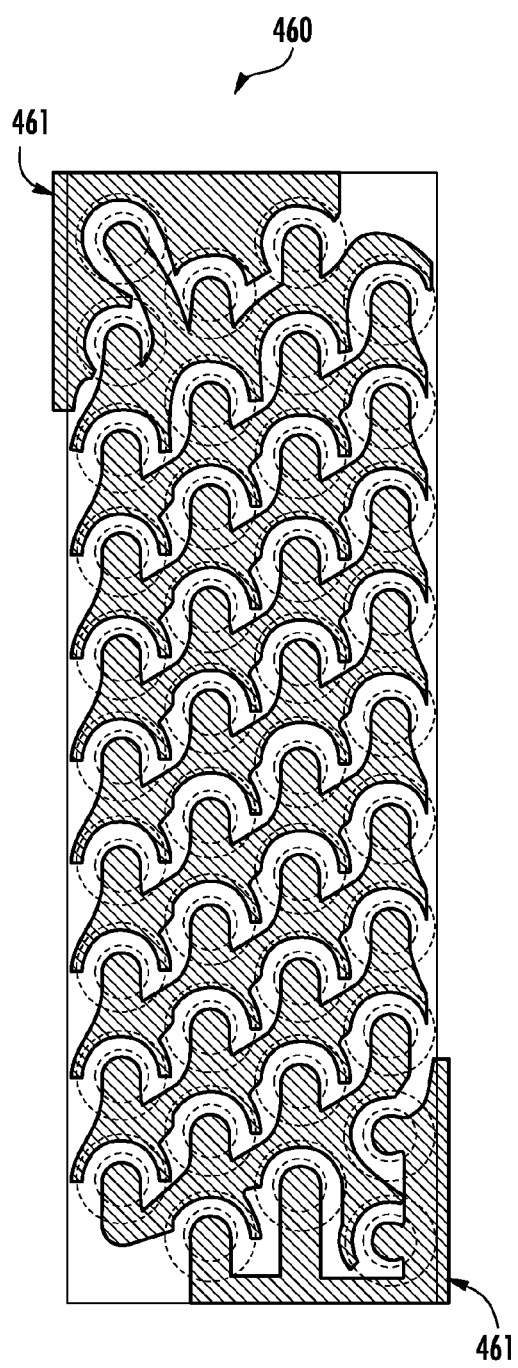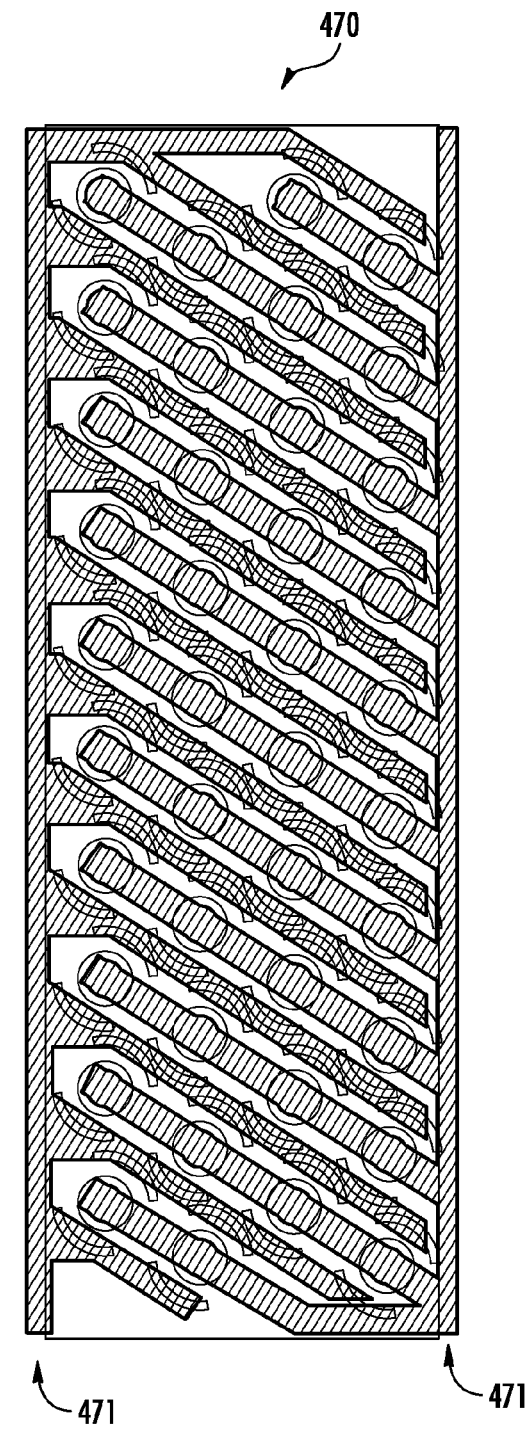
FIG. 10
FIG. 11

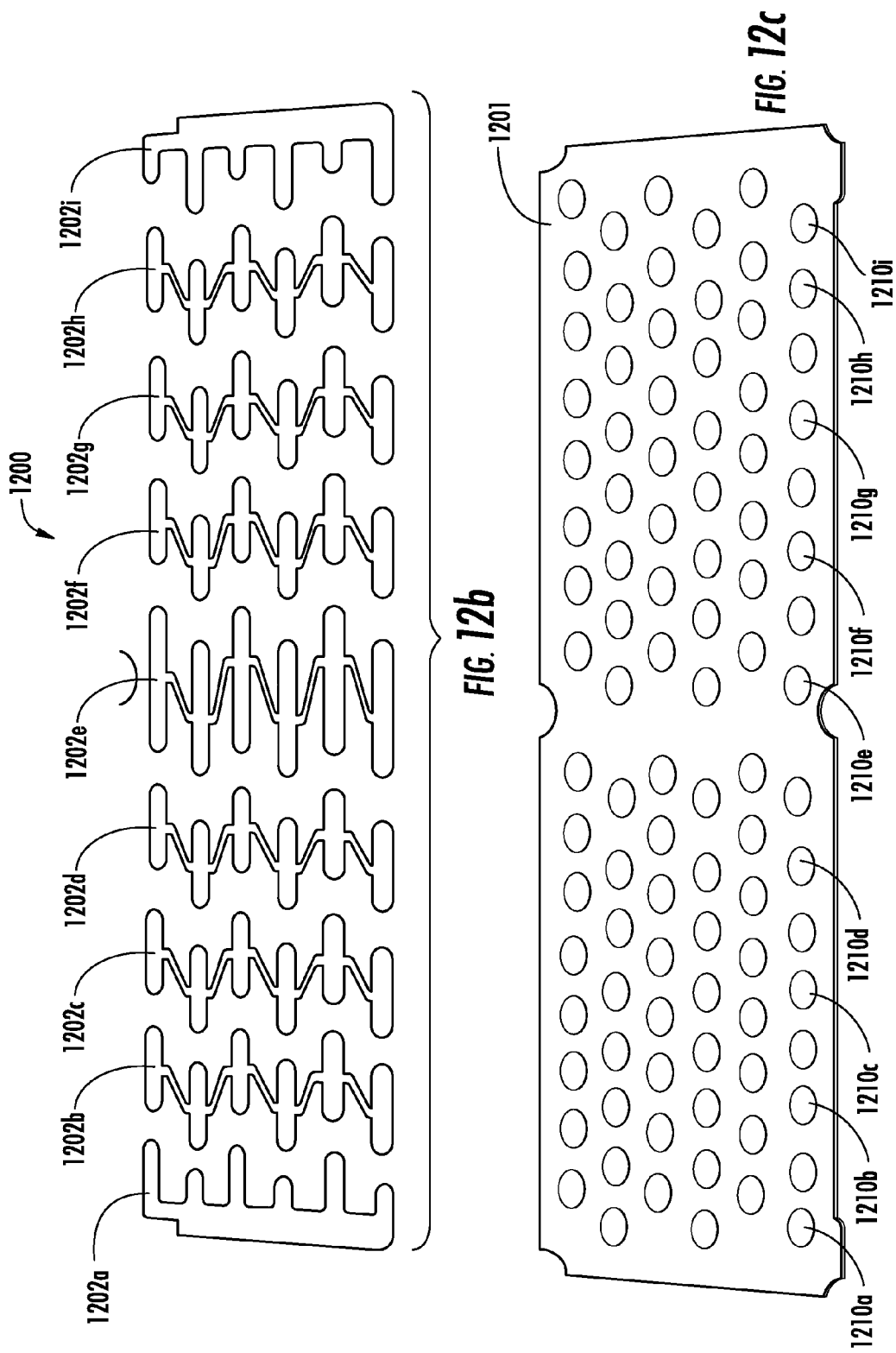

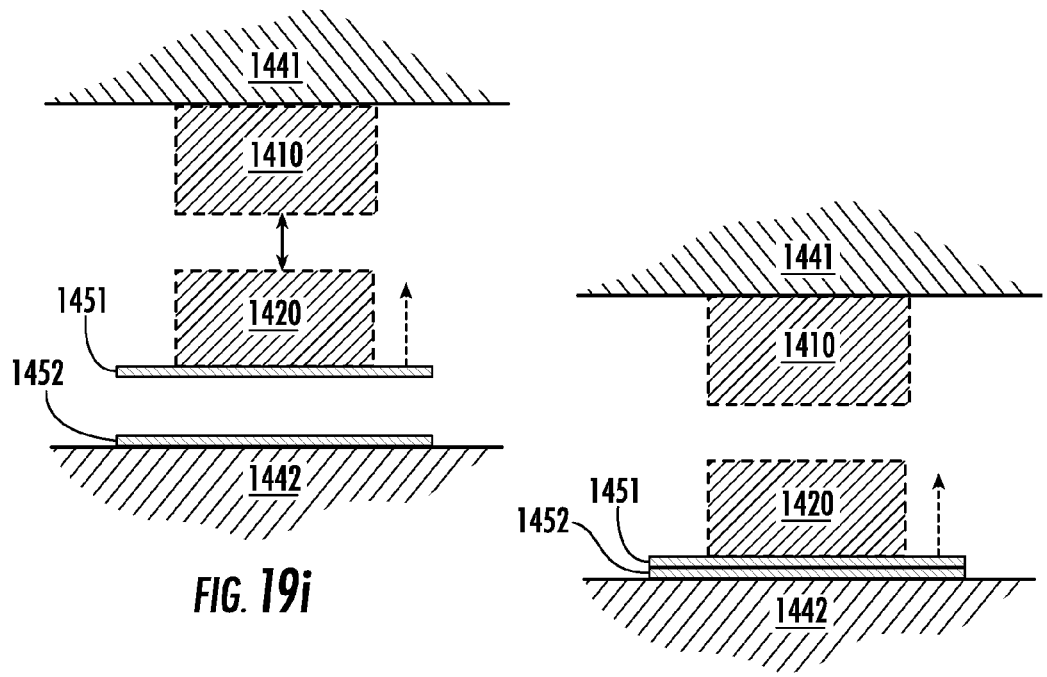
FIG. 19i
FIG. 19j
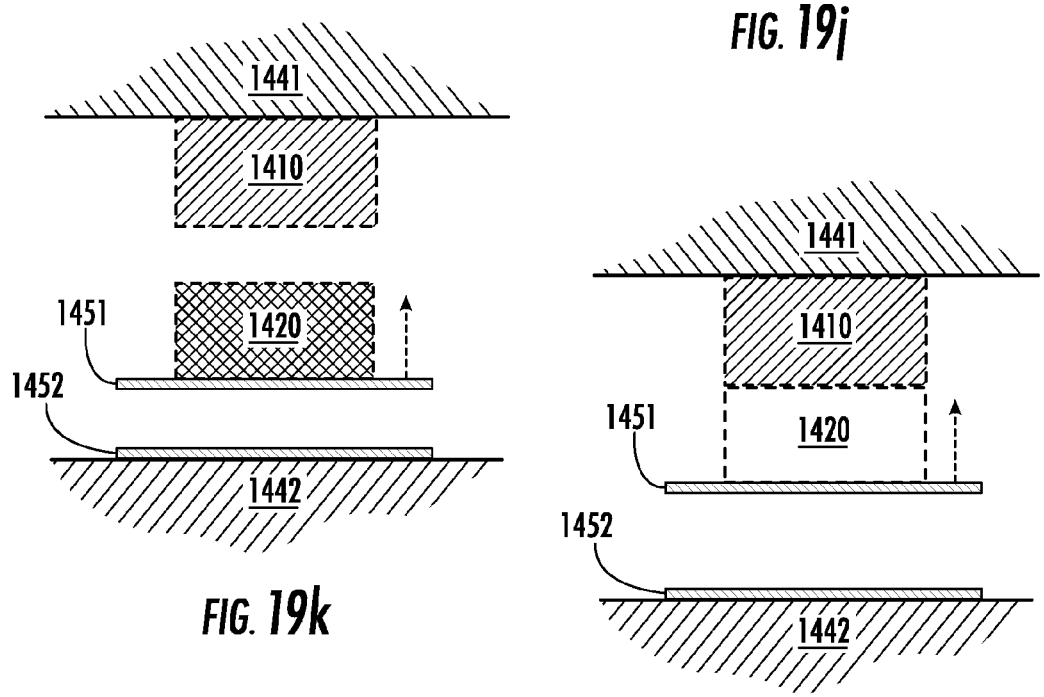
FIG. 19k
FIG. 19l

MODULAR INTERCONNECTION SYSTEM

CROSS-REFERENCE TO RELATED APPLICATIONS

This application is a continuation of application Ser. No. 12/724,388 (titled "Modular Interconnection System," filed Mar. 15, 2010, and is related to application Ser. No. 12/724,382 (titled "Variable Energy System"), filed Mar. 15, 2012, application Ser. No. 12/724,410 (titled "Impedance Balancer"), filed Mar. 15, 2012, and application Ser. No. 12/724,364 (titled "Power Cell Array Receiver"), filed Mar. 15, 2010, and each of which are incorporated herein by reference in their entirety.

TECHNICAL FIELD

Embodiments of the present invention relate generally to electrically connecting components, and, more particularly, relate to a modular interconnection system.

BACKGROUND

Energy storage and generation technologies are rapidly evolving as consumers increase their demand for energy solutions that are both convenient and environmentally-friendly. Energy systems, which may include energy storage or generation systems, often include a number of smaller cells, for example rechargeable battery cells, that are electrically connected together. In many systems, these cells are connected via permanent connections, such as tack welded connections, to form the electrical connections between the cells. The connections between the cells in these known systems are configured such that the energy system supports a permanent voltage and current capacity configuration for use with a single application. Further, the permanent connections between the individual cells tend to degrade over the life of the power cells in response to thermal stresses, vibrations, and the union of different metals when, for example, tack welding is used. Micro-fractures in the welds can develop resulting in poor conduction, poor energy transport efficiency, and additional heat.

BRIEF SUMMARY

Example embodiments of the present invention include a modular interconnection system and a releasable modular interconnect configured to connect a number of power cells within an energy system in series and parallel groups to achieve a desired voltage and current capacity. An energy system may refer to an energy storage system or an energy generation system. The term "power cells" refers to, for example, battery cells in an energy storage system, solar cells in an energy generation system, or the like. The releasable modular interconnect can be configured to form releasable electrical connections with terminals (e.g., positive and negative terminals) of the power cells. The releasable connections can facilitate cell replacement, energy system maintenance, and energy system remanufacture in a non-destructive manner, as well as minimize the degradation in efficiency of an energy system's output over time, relative to, for example, a tack welded system. Additionally, in some example embodiments, magnetic members may be positioned in association with respective releasable contacts of the releasable modular interconnect. The magnetic members can magnetically couple to the power cells to generate a force that holds the releasable contacts of the releasable modular interconnect in position to form an electrical connection with the terminals of the power cells. In some example embodiments, the magnitude of the magnetic field generated by the magnetic members may be a function of the temperature of the magnetic member. In this regard, the magnetic members may be placed proximate the power cells or the electrical connection to receive heat produced by the cells or ohmically. If a power cell should generate excessive heat, possibly due to an impending failure, the magnetic field generated by a magnetic member may be reduced as a result of the heat absorbed by the magnetic member, thereby causing a responsive reduction in a force being applied to the releasable contact of the releasable modular interconnect toward the terminal of the cell. An electrical disconnection with the power cell may result from the reduction in the applied force. These and additional example embodiments of the present invention are further described below.

BRIEF DESCRIPTION OF THE DRAWING(S)

Having thus described the invention in general terms, reference will now be made to the accompanying drawings, which are not necessarily drawn to scale, and wherein:

FIG. 8 illustrates an example substrate for use with power cells having access to both positive and negative terminals on a common face of the power cells according to various example embodiments;

FIG. 9 illustrates a conductive pattern for an example releasable modular interconnect that may be affixed to the substrate of FIG. 8 according to various example embodiments;

FIGS. 10 and 11 illustrate additional conductive patterns for releasable modular interconnects according to various example embodiments;

FIG. 12b illustrates conductive interconnect members according to various example embodiments;

FIG. 12c illustrates a lower substrate layer for a releasable modular interconnect according to various example embodiments;

FIGS. 19a-19l illustrate various techniques for forming magnet-assisted connections that may be used to electrically connect or disconnect a releasable contact of a releasable modular interconnect to or from a power cell terminal according to various example embodiments;

DETAILED DESCRIPTION OF THE DRAWINGS

Figure 1:
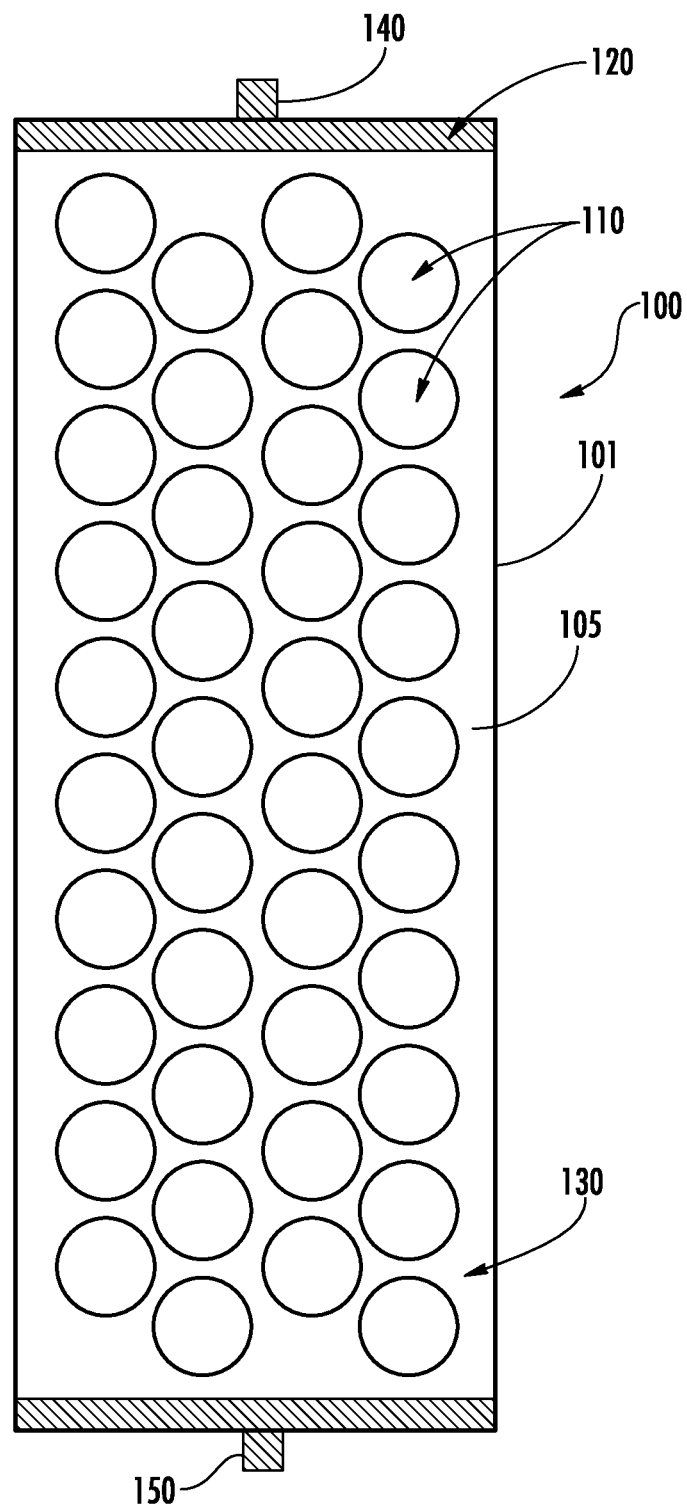
FIG. 1 is an illustration of a top view of an example container of an energy system for housing multiple power cells according to various example embodiments.

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein. Like reference numerals refer to like elements throughout.

According to various example embodiments of the present invention, a releasable modular interconnect is provided that is configured to form releasable electrical connections with a plurality of power cells within an energy system. A power cell may be any type of apparatus that outputs power, for example electrochemical or electrostatic cells, which may include batteries (e.g., lithium-ion, lead-acid, metal-air batteries, and the like), capacitors (e.g., ultracapacitors, supercapacitors, and the like), fuel cells, photovoltaic cells, Peltier junction devices, piezoelectric cells, thermopile devices, solid state conversion cells, other hybrids of electrochemical and electrostatic cells, or the like, and combinations thereof. Each power cell may, for example, be a cylindrical device that includes a positive and negative terminal. However, example embodiments of the present invention are not limited to cylindrically-shaped power cells. For example, prismatic power cells may additionally or alternatively be utilized. Releasable electrical connections may be formed with the positive or negative terminals of a power cell via releasable contacts of a releasable modular interconnect. The releasable modular interconnect may be designed in accordance with one or more of a variety of conductor patterns for connecting the power cells. For a given pattern, parallel and series connections between the power cells are formed, which determines the output voltage and current capacity of an energy system. A releasable modular interconnect can also include positive and negative polarity interconnect output terminals for outputting the voltage and current that is provided by the electrical configuration of the power cells. In this regard, the output voltage of the energy system may be measured across the interconnect output terminals.

According to various example embodiments, because the electrical connections between the releasable modular interconnect and the power cells are releasable, an energy system that utilizes a releasable modular interconnect can be readily maintained through removal of the releasable modular interconnect and, for example, replacement of a failed power cell. In this regard, a releasable electrical connection may be an electrical connection that is formed by a force or pressure that is applied between a conductive releasable contact of the releasable modular interconnect and a terminal of a power cell. According to some example embodiments, the releasable modular interconnect can be removed or detached from the power cells by overcoming any forces that hold the releasable modular interconnect in place, including the forces holding the conductive releasable contacts to the power cell terminals, by, for example, lifting the releasable modular interconnect away from the power cells. According to some example embodiments, the releasable modular interconnect, after being accessed through removal of, for example, a housing cover, may be removed without the use of tools. The releasable modular interconnect may be held in alignment by, for example, alignment pins, springs, magnets, or a cover associated with a container, wherein the cover may have springs, alignment pins, or the like for holding the releasable modular interconnect in place. According to some example embodiments, the removal of the releasable modular interconnect may be performed in a non-destructive manner such that no component of the energy system must be discarded or repaired as a result of removal of the releasable modular interconnect from the energy system. As a result of this feature, some example embodiments provide for maintenance of the energy system in an efficient and inexpensive manner.

Further, the releasable modular interconnect can be utilized in environments that experience vibrations, such as, for example, being affixed to a moving vehicle or bike. Further, in some environments the releasable modular interconnect, the electrical connections, and the power cells may be subjected to thermal cycling, for example in the context of a photovoltaic energy system, which can have further effects on the quality of the components and electrical connections. Because, according to some example embodiments, the connections between the releasable contacts of the releasable modular interconnect are permitted to move slightly while maintaining an electrical connection, fatigue on the releasable contacts is reduced or eliminated, relative to a fixed, for example tack welded, connection. Fatigue can cause degradation in the quality of a fixed connection, and result in reduced power transfer efficiency. Since some example embodiments are not affected by vibrations in the same way a fixed connection is affected, improved power transfer can be realized, particularly over the life of an energy system.

The releasable electrical connections also facilitate removal of a releasable modular interconnect for replacement with another releasable modular interconnect resulting in a different electrical configuration of the cells. Since the removal and replacement of the releasable modular interconnect may be performed in a non-destructive manner, the releasable modular interconnect provides for increased application flexibility for an energy system. Further, replacement of a releasable modular interconnect can also facilitate electrical reconfiguration of energy systems that have already been deployed.

Further, according to some example embodiments, the forces applied to form the releasable electrical connections between the contacts of the releasable modular interconnect and the terminals of power cells may be generated through implementation of one or more magnetic members. In this regard, a magnetic member may be associated with each contact of the releasable modular interconnect that magnetically couples to the power cell or the terminal of the power cell. The magnetic coupling can generate a force that holds the releasable contact in electrical connection with the terminal of the power cell to form the releasable electrical connection.

In some example embodiments, disconnect forces may also be applied to the releasable contacts, for example via disconnect springs, disconnect magnets, or the like, to facilitate breaking or maintaining a broken electrical connection of a releasable contact from the terminal of the power cell. A magnetic member may be configured to provide sufficient magnetic coupling to generate a force that overcomes the disconnect force. In some example embodiments, the magnetic member associated with a releasable contact may generate a magnetic field having a magnitude that is a function of the temperature of the magnetic member. In this regard, the magnitude of the magnetic field generated by the magnetic member may be reduced as the temperature of the magnetic member rises. As such, according to some example embodiments, the characteristics of the magnetic member (e.g., the Curie temperature) may be selected such that the force generated by the magnetic field of the magnetic member is insufficient to overcome the disconnect forces at a selected temperature, and the electrical connection between the releasable contact and the terminal of the power cell may be broken due to resultant movement of the releasable contact away from the terminal. Since power cells that are nearing failure often generate increasing amounts of heat, a magnetic member that is proximate the failing cell can receive the thermal energy generated by the failing power cell and break the releasable electrical connection to the failing power cell. Similarly, the electrical connections themselves can be a source of heat due to the ohmic resistance of the connections and the magnetic member may be positioned proximate the electrical connect to thereby receive ohmic heat generated by the electrical connection, which can indicate the current flowing through the connection. In this regard, the resistance of a contact or portion of a conductive interconnect member can be designed such that if the current through a said portion exceeds a chosen limit, the ohmic heating can effect the magnetic member to cause a responsive reduction in a holding force to break the electrical connection. By breaking the releasable electrical connection to the terminal of the failing power cell, the failing power cell may be removed from the electrical circuit, thereby limiting the heat generated by the failing cell and eliminating the failing cell from the current path. In the case where a system is exceeding its designed current capacity, a releasable contact electrically connected to the terminal of a power cell in one parallel group may break the electrical connection to form an open circuit with respect to that contact and power cell. In some instances, this may be followed by an increasingly rapid opening of all other electrical connections in that parallel group. Note that the current can change from X/P per cell to X/(P−1) after the first cell opens, then X/(P−2) and so on as the failures cascade, where X is the system terminal current and P is the number of cells in parallel.

According to some example embodiments, a releasable modular interconnect may also be flexible. In this regard, a releasable modular interconnect may include a flexible nonconductive substrate, for example in the form of a sheet, that provides flexible mechanical support to the conductive interconnect members of the releasable modular interconnect. In some example embodiments, the substrate may be rigid.

The layout of the conductive interconnect members of a releasable modular interconnect may be defined by a pattern for connecting the various power cells in a desired configuration. The conductive interconnect members may include releasable contacts that are configured to form the electrical connections with the power cells. According to some example embodiments, some or all of the conductive interconnect members of the releasable modular interconnect may be comprised of a conductive, flexible foil. According to some example embodiments, the flexibility of a releasable modular interconnect not only supports the non-destructive removal of the releasable modular interconnect, as described above, but also allows the releasable contacts of the releasable modular interconnect to deform or deflect to maximize the amount of surface area of the contacts that interacts with the terminals of the power cells. As a result, improved electrical connections can be realized. Further, according to some example embodiments, due to high surface area to volume ratio, a high aspect ratio, or otherwise a thin profile of some example releasable modular interconnects, heat dissipation from the power cells may also be increased.

Energy systems that utilize the releasable modular interconnect may be employed in a variety of settings. For example, vehicles, including cars, trucks, bikes, and the like, may be powered by an energy system and recharged when the vehicles are not in use or though mechanisms, such as, for example, energy recapture techniques. Additionally, energy systems may be utilized in coordination with smart grid technologies to perform, for example, grid peak shaving, backup power, and the like. Further, due to the application flexibility that the releasable modular interconnect brings to the energy systems, an energy system may be repurposed or remanufactured such that, for example, an energy system may be used with an electric bike that requires a 12 volt supply, and through replacement of the releasable modular interconnect, the same energy system may be used as backup power system for a household inverter that requires a 24 volt supply voltage.

In light of the foregoing, FIG. 1 illustrates an example arrangement of power cells within an energy system 100, which includes a power cell array receiver (PCAR) 105 for holding the power cells laterally in place. The PCAR 105 includes apertures 110 for receiving and holding the power cells. While the FIG. 1 depicts apertures 110 in an example hexagonal grid arrangement for holding forty power cells, it is contemplated that a PCAR may be designed to hold any number of power cells in various positions. Since power cells often have one or more terminals on a top or bottom surface, the arrangement of the apertures can provide a general indication of the placement of releasable contacts for a releasable modular interconnect. Based on the releasable contact locations, various patterns for a releasable modular interconnects may be designed to generate desired voltages and current capacity characteristics for the energy system. The energy system 100 also includes output buses 120 and 130 that are positioned to form an electrical connection with interconnect output terminals, and in some example embodiments, the connection with the output buses can be formed with the assistance of a magnetic force produced by associated magnetic members. Similar to the releasable electrical connection between the releasable contacts and the terminals of the power cells, the electrical connection between the interconnect output terminals and the output buses 120 and 130 may be releasable. According to some example embodiments, the output buses 120 and 130 may be electrically connected to energy system output terminals 140 and 150, respectively. The energy system output terminals may ultimately be connected to a load or other energy systems to facilitate the delivery of power. While the output buses 120 and 130, and the energy system output terminals 140 and 150 are depicted at opposite ends of the energy system 100 in FIG. 1, it is contemplated that the output buses 120 and 130, and energy system output terminals 140 and 150 may be positioned at various locations within the housing of the energy system 100 to facilitate various applications for the energy system. For example, the output buses and energy system output terminals may be positioned on the same end of the housing or the output buses 120 and 130 may be positioned along the longitudinal edges of the housing. Corresponding placement of the interconnect output terminals within the releasable modular interconnect is also contemplated.

Figure 2:
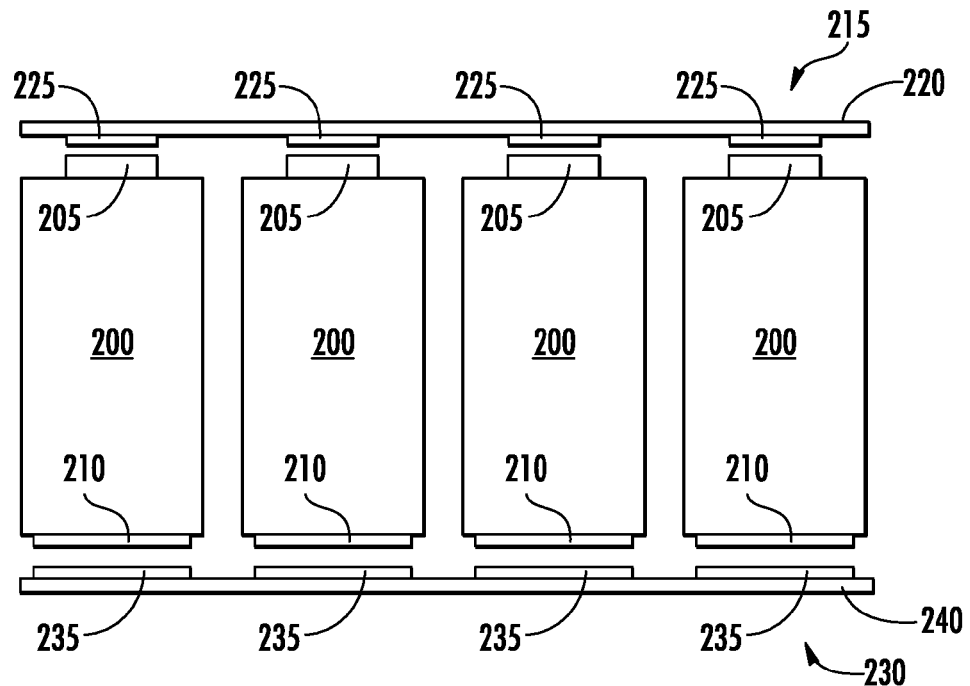
FIGS. 2 and 3 illustrate cut-away side views of an interaction between power cells and releasable modular interconnects according to various example embodiments.

FIG. 2 illustrates an example cutaway side view of a portion of an energy system that includes four power cells 200, an upper releasable modular interconnect 215 and a lower releasable modular interconnect 230. Each power cell 200 includes a respective first terminal 205 and second terminal 210. The first terminal 205 may have a positive polarity and the second terminal 210 may have a negative polarity. Because the power cells 200 have terminals on both the top and bottom surfaces of the cells, the upper releasable modular interconnect 215 and the lower releasable modular interconnect 230 may be used to connect the cells in a desired electrical configuration. According to some example embodiments, a power cell may have a top terminal that is electrically isolated from the canister of the power cell, which may be configured to operate as the second terminal.

The upper releasable modular interconnect 215 and the lower releasable modular interconnect 230 may include substrates 220, 240 and releasable contacts 225, 235, respectively. The substrates 220 and 240 may be comprised of any type of insulating material, for example plastic, polyurethane, polyester, polymeric material, other non-conducting organic material, mica, other non-conducting inorganic material, or the like. In some example embodiments, due to the thickness or characteristics of the material that is used for the substrate 220, the substrate may be rigid or flexible. In some example embodiments, where the power cells may need to discharge a reactant gas, a flow path through, for example, apertures in the substrate may be provided.

The releasable contacts 225 and 235 may be portions of conductive interconnect members that form the electrical connections between the terminals of the power cells. The conductive interconnect members may be affixed to a substrate, or disposed between layers of the substrate. In some example embodiments, the conductive interconnect members may be affixed (e.g., glued, thermally bonded, laminated, screen printed, or the like) to a layer of the substrate and apertures may be cut or otherwise removed from the substrate to allow the releasable contacts of the conductive interconnect members to make an electrical connection with a terminal of cell. An opposite side of the conductive interconnect member may be laminated with another layer of the substrate. The conductive interconnect members may be comprised of any type of conductive material including copper, aluminum, silver, conductive inorganics, conductive organics, or the like, and may be embodied as a thin, flexible foil. In some example embodiments, the conductive interconnect members may be punched or cut from a copper sheet (e.g., 1 ounce copper sheet). In some example embodiments, the conductive interconnect members may be configured to support high currents and may have a perimeter to thickness aspect ratio normal in the direction of current flow of, for example, 10:1 or higher.

For illustration purposes, the upper releasable modular interconnect 215 is shown with a gap between the releasable contacts 225 and the terminals 205, but when in operation, the upper releasable modular interconnect 215 is positioned such that releasable contacts 225 form an electrical or physical connection with the terminals 205. Similarly, for illustration purposes, the lower releasable modular interconnect 230 is also shown with a gap between the releasable contacts 235 and the terminals 210, but when in operation, the lower releasable modular interconnect 230 is positioned such that releasable contacts 235 form an electrical or physical connection with the terminals 210. According to some example embodiments, a conductive paste or grease may be applied between the releasable contacts and the power cell terminals to facilitate the formation of a high quality (e.g., low impedance) electrical connection. In this regard, according to some example embodiments, the releasable contacts and the terminals may not be in physical releasable contact, but an electrical connection between the releasable contact and the terminal of the power cell may be generated via the conductive paste.

Additionally, the releasable electrical connections that are formed between the terminals 205 and 210 and the releasable contacts 225 and 235 may be facilitated by a force that is applied to bring the releasable contacts toward the terminals. The force may be the result of magnetic coupling between a magnetic member that is affixed, for example, to the releasable modular interconnect or to the power cell. The magnetic member may be paramagnetic, ferromagnetic, ferrimagnetic, or the like. In some example embodiments, the magnetic member may be affixed to the releasable modular interconnect and the power cell may be imprinted with a magnetic field. In this regard, the magnetic field generated by the power cell may facilitate generation of the connection force.

It is noteworthy that while the power cells 200 of FIG. 2 are depicted with the polarity orientation (e.g., all the positive terminals facing upward), in some example embodiments, one or more power cells may be in an opposite polarity orientation (e.g., with the positive terminals facing downward). The patterns used for the releasable modular interconnects may be designed to accommodate such a mixed polarity orientation of the power cells.

Figure 3:
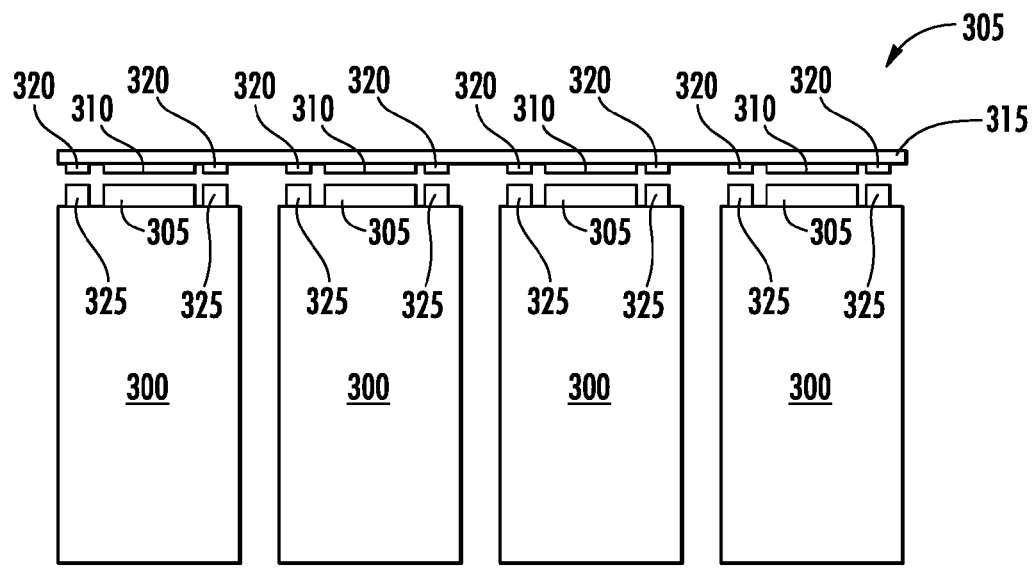

FIG. 3 is a cut-away depiction of an alternative embodiment where the power cells 300 include first terminals 305 (e.g., positive terminals) and second terminals 325 (e.g., negative terminals) on the same face of the power cells 300. According to some example embodiments, when a releasable modular interconnect is configured to form connections with both terminals of a power cell on the same face of the power cell, a single releasable modular interconnect 305 may be used to generate a desired electrical configuration of cells. According to some example embodiments, multiple layers of interconnect members, possibly isolated from each other by non-conductive substrate layers may be used to generate a desired electrical configuration. The releasable modular interconnect 305 includes a substrate 315, first releasable contacts 310 and second releasable contacts 320. The first releasable contacts 310 of the releasable modular interconnect 305 are positioned to form an electrical connection with the first terminals 305 of the power cells 300. The second releasable contacts 320 of the releasable modular interconnect 305 are positioned to form an electrical connection with the second terminals 325. Again, although FIG. 3 depicts a gap between the releasable modular interconnect 305 and the terminals of the cells 300, when in operation, the releasable modular interconnect 305 is positioned such that releasable contacts 310 and 320 form an electrical or physical connection with the terminals 305 and 325, respectively. According to some example embodiments, the releasable contacts and the terminals may not be in physical releasable contact, but an electrical connection between the releasable contact and the terminal of the power cell may be generated via a conductive paste.

Figure 4:
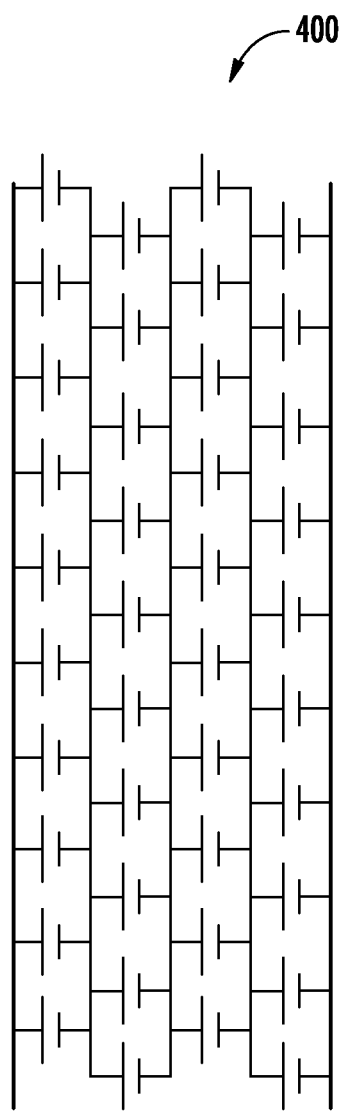
FIGS. 4 and 5 illustrate example electrical configurations that may be generated by an example releasable modular interconnect according to various example embodiments.
Figure 5:
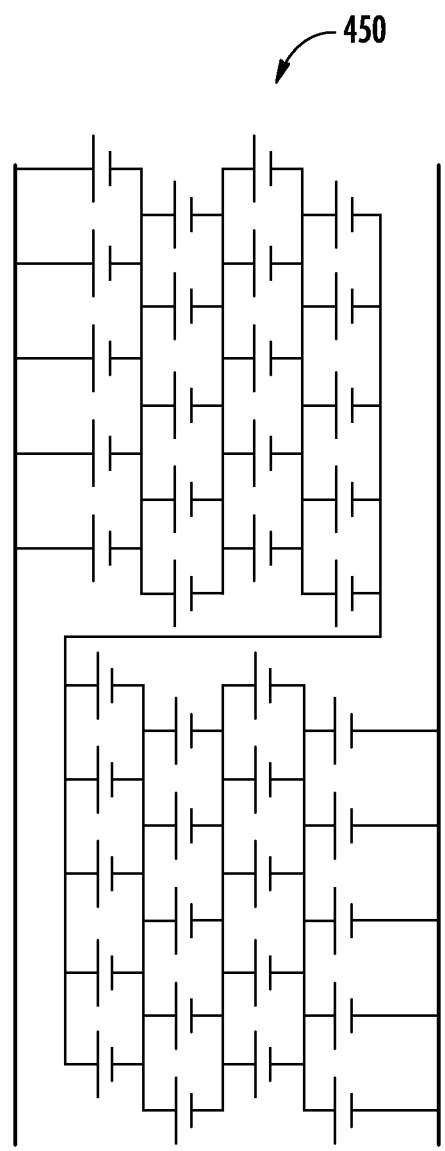

A variety of voltages and current capacities can be achieved by an energy system, based on the connections that are made amongst the cells by the releasable modular interconnect. FIGS. 4 and 5 provide two of the many electrical configurations that can be generated through the use of a releasable modular interconnect that is designed to generate the desired voltage and current capacity outputs. As described above, based on the pattern of the releasable modular interconnect parallel groups of cells maybe generated. The pattern can also connect the parallel groups in series. To describe an electrical configuration of this type, a nomenclature of xsyp can be used, where x is the number of parallel groups that are in series, and y is the number of power cells in a parallel group. Referring to the electrical configuration 400 of FIG. 4, each parallel group includes ten power cells, and four parallel groups are in series. As such, electrical configuration 400 is a 4s10p electrical configuration. With respect to the electrical configuration 450 of FIG. 5, each parallel group includes five power cells and eight of the parallel groups are connected in series. As such, the electrical configuration 450 is an 8s5p configuration.

While a releasable modular interconnect designed to generate, for example, a 4s10p configuration will have a different pattern than a releasable modular interconnect designed to generate an 8s5p configuration, the arrangement of the power cells within a particular housing, according to various example embodiments, may be the same. For example, using the PCAR 105 of FIG. 1, a 4s10p configuration or an 8s5p configuration may be achieved by using differently patterned releasable modular interconnects. As such, according to some example embodiments, merely by replacing a first releasable modular interconnect (or a first set of upper and lower releasable modular interconnects) with a second releasable modular interconnect (or a second set of upper and lower releasable modular interconnects), different voltage and current capacity characteristics of an energy system can be achieved using the same PCAR and power cells.

Figure 6:
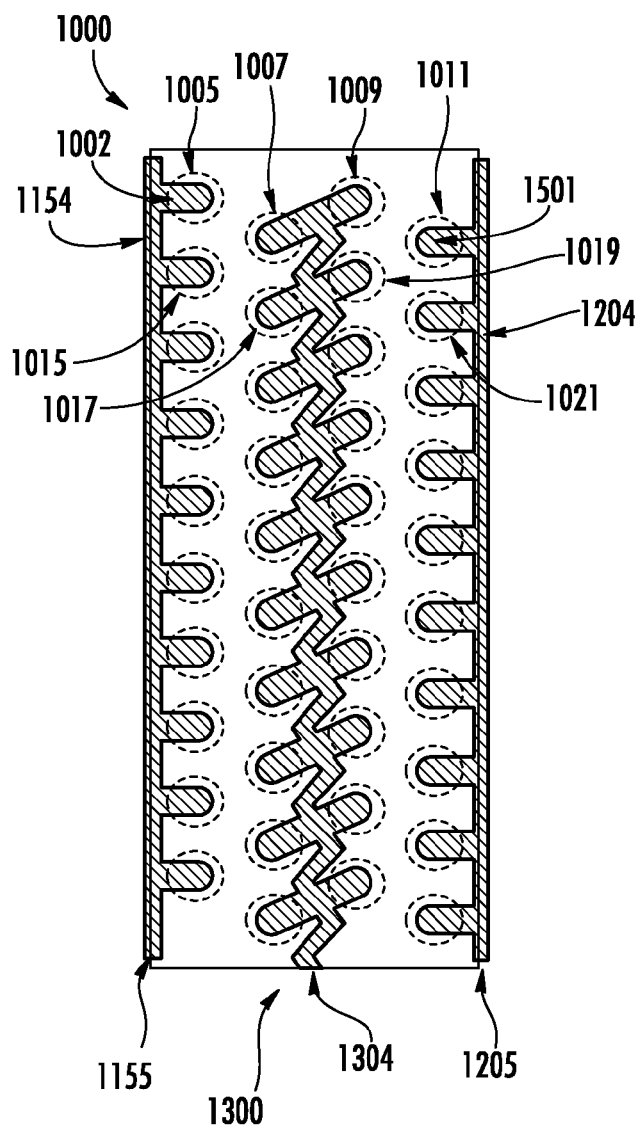
FIG. 6 illustrates an example releasable modular interconnect according to various example embodiments.
Figure 7:
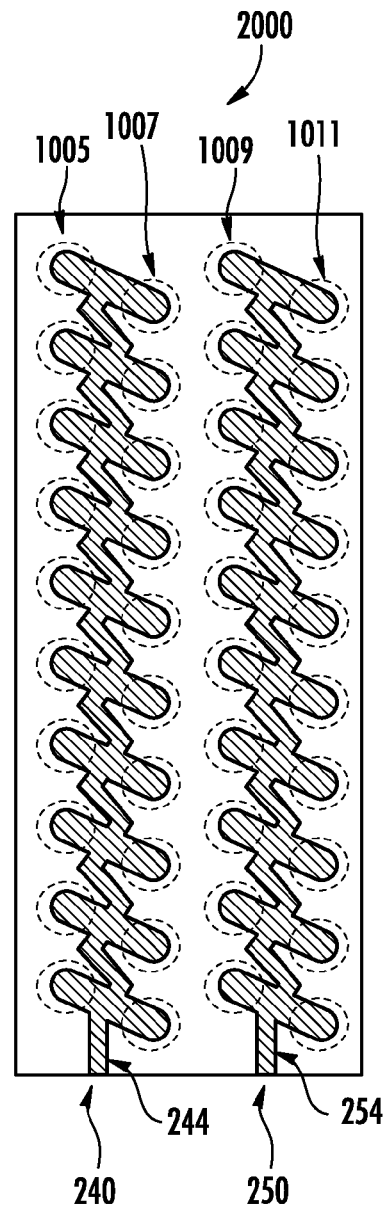
FIG. 7 illustrates another example releasable modular interconnect that is complementary to the releasable modular interconnect of FIG. 6 according to various example embodiments.

FIG. 6 illustrates an example releasable modular interconnect 1000 that is an upper releasable modular interconnect. FIG. 7 illustrates another example releasable modular interconnect 2000, that is a lower releasable modular interconnect. The lower releasable modular interconnect 2000 is configured to compliment the upper releasable modular interconnect 1000 to form a desired electrical configuration of power cells. The conductive pattern of the releasable modular interconnects 1000 and 2000 may be comprised of a number of conductive interconnect members that include paralleling members, bus members, and releasable contacts for forming an electrical connections between the terminals of power cells.

The releasable modular interconnect 1000 includes a first interconnect releasable contact region 1002 for electrically connecting a terminal of a first cell at 1005 through the first interconnect releasable contact region 1002 to a paralleling member 1154 of the bus member 1155. Bus member 1155, which may also be a interconnect output terminal, may have a first polarity. The central area 1300 of the releasable modular interconnect may be configured to form cell-to-cell connections, such as, for example, the connections between the cells at 1007 and 1009. A second interconnect releasable contact region 1501 electrically connects a cell at 1011 to a paralleling member 1204 of the bus member 1205. Bus member 1205, which may also be an interconnect output terminal, may be of a second polarity. The cells at 1005 and 1015, as well as the cells located linearly below 1005 and 1015 in FIG. 6 are electrically connected in parallel via paralleling member 1154 and paralleling member 244 of FIG. 7. The cells at 1007 and 1017, as well as the cells located linearly below the cells at 1007 and 1017 in FIG. 6 are connected in parallel via paralleling member 1304 and paralleling member 244 of FIG. 7. The cells at 1009 and 1019, as well as the cells located linearly below the cells at 1009 and 1019 in FIG. 6 form a separate parallel group connected in parallel via paralleling member 1304 and paralleling member 254 of FIG. 7. The cells at 1011 and 1021, as well as the cells located linearly below the cells at 1011 and 1021 in FIG. 6 are connected in parallel via paralleling member 1204 and paralleling member 254 of FIG. 7. Further, the releasable modular interconnect 2000, which is complementary to releasable modular interconnect 1000, connects a second polarity terminal of a cell at 1005 to a first polarity terminal of a cell at 1007 through cell-to-cell conductive interconnect member 240. Similarly, the second polarity terminal of a cell at 1009 is connected to the first polarity terminal of a cell at 1011 through cell-to-cell conductive interconnect member 250. Via the connection described above and as otherwise illustrated in FIGS. 6 and 7, the resultant parallel groups formed via the connections are electrically connected in series to form a 4s10p configuration as depicted in FIG. 4.

FIG. 8 illustrates an example layout of a substrate 850 for use with a plurality of power cells that have access to two terminals on the same face of the power cells (e.g., both positive and negative polarity terminals are able to contacted on the same face of the power cells), similar to the releasable modular interconnect 305 depicted in FIG. 3. Apertures 851 and 852 are positioned to allow a conductive interconnect member that overlays the apertures to be a releasable contact, and form an electrical connection with respective terminals of an underlying cell. The apertures 851 are, for example, semicircular openings configured to align with a portion of a first terminal of the respective power cell and the apertures 852 are configured to align with a second terminal of the respective power cell. In relation, FIG. 9 illustrates a pattern for the conductive portion 853 of an example releasable modular interconnect that can be affixed to the substrate 850 for forming electrical connections with positive and negative terminals of the power cells. Power cells may be located at, for example, 1006, 1008, 1010, and 1012. The conductive interconnect members 241, 1301, and 251 form cell-to-cell connections, and the conductive interconnect members 1156 and 1106 form bus members for the interconnect output terminals. The releasable modular interconnect comprising the substrate 850 and the conductive portion 853 can be configured to generate a 4s10p cell configuration, as depicted in FIG. 4. FIGS. 10 and 11 illustrate additional examples of releasable modular interconnects 460 and 470 configured to make positive and negative polarity electrical connections on the same face of the power cells. Releasable modular interconnect 460 includes interconnect output terminals 461. Similarly, releasable modular interconnect 470 includes interconnect output terminals 471. The releasable modular interconnect 460 forms a 10s4p electrical configuration and the releasable modular interconnect 470 forms a completely parallel electrical configuration (i.e., all power cells are connected in parallel).

Figure 12A:
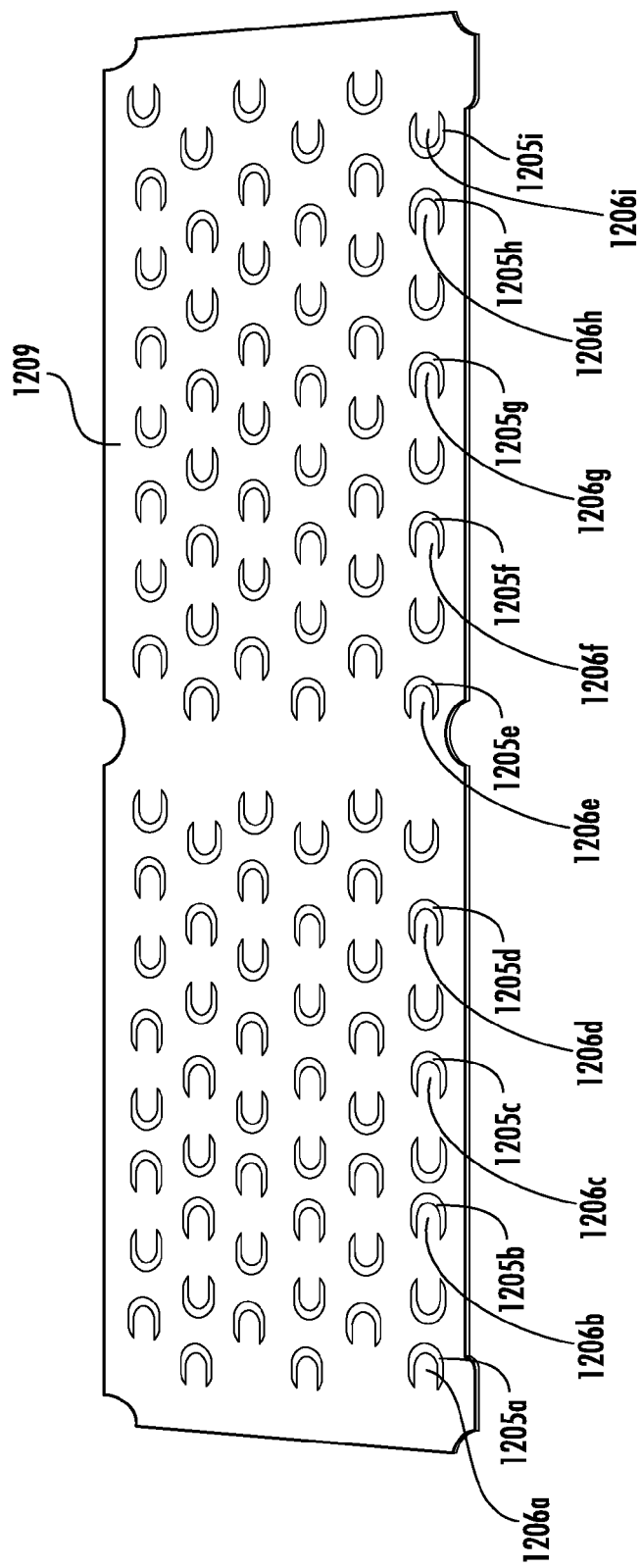
FIG. 12a illustrates an upper substrate layer of a releasable modular interconnect according to various example embodiments.
Figure 12D:
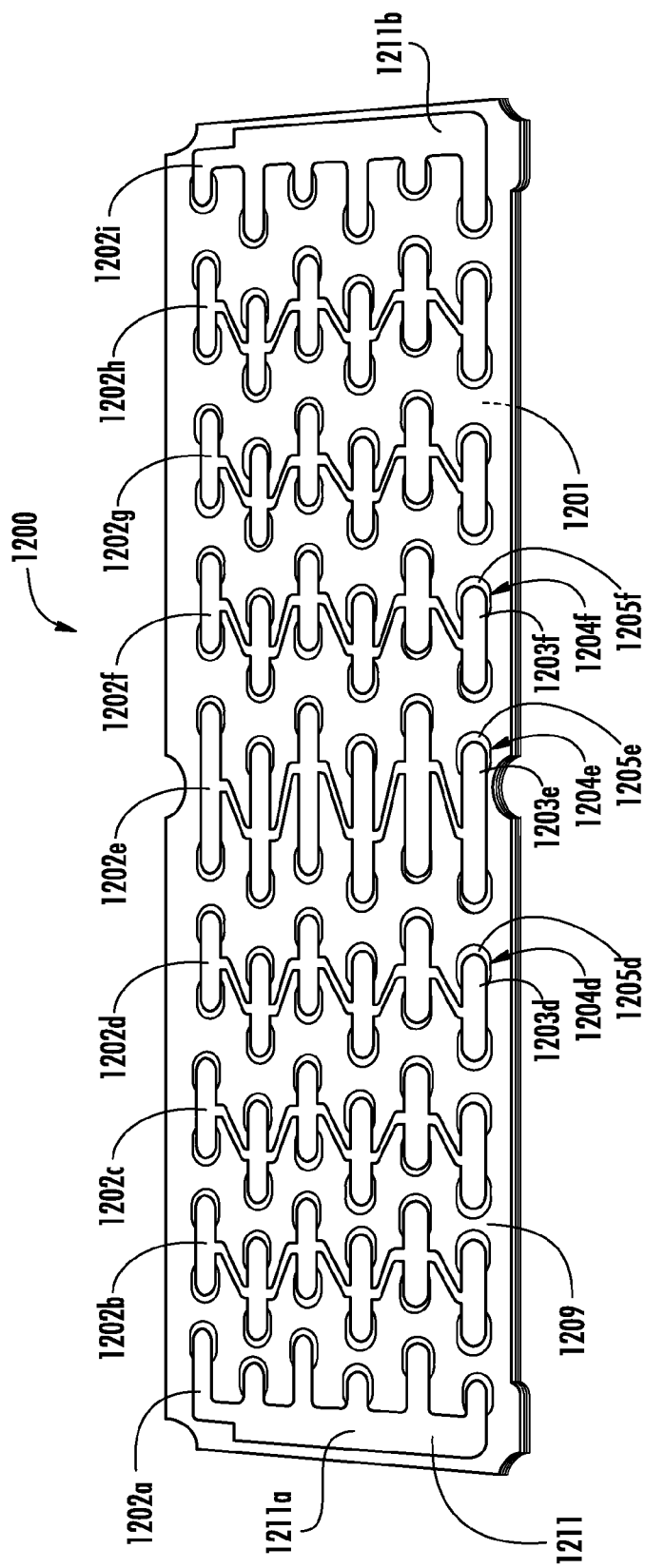
FIG. 12d illustrates a releasable modular interconnect that includes the upper laminate sheet of FIG. 12a, the conductive interconnect members of FIG. 12b, and the lower laminate sheet of FIG. 12c according to various example embodiments.

FIGS. 12a, 12b, and 12c illustrate layers of a releasable modular interconnect 1200 depicted in FIG. 12d. The upper substrate layer 1209 of FIG. 12a may be constructed of a nonconductive material, such as a laminate. Apertures 1205 (e.g., apertures 1205a through 1205i) are areas where the material of the upper substrate layer 1209 has been removed to result in substrate tabs 1206 (e.g., substrate tabs 1206a through 1206i). FIG. 12b illustrates conductive interconnect members 1202 (e.g., conductive interconnect members 1202a through 1202i), which include areas that are releasable contacts 1203 (e.g., releasable contacts 1203d through 1203f as depicted in FIG. 12d). The conductive interconnect members or at least the releasable contacts 1203 may be comprised of a flexible, conductive foil. The conductive interconnect members 1202 may be affixed by, for example, a glue or the like to the underside surface of the upper substrate layer 1209. According to some example embodiments, the tabs 1206 of may overlay and be affixed to a top surface of the releasable contacts 1203. In some example embodiments, the substrate tabs 1206 may also be affixed to magnetic members on a top surface of the substrate tabs 1206. FIG. 12c illustrates a lower substrate layer 1201, which may also be constructed of a nonconductive material, such as a laminate. Apertures 1210 (e.g., apertures 1210a through 1210i) are areas where the material of the lower substrate layer 1201 has been removed to expose the releasable contacts 1203 through the apertures 1210 for connection to a power cell terminal. The lower substrate layer 1201 is affixed to the underside surface of the upper substrate layer 1209 and the conductive interconnect member 1202, such that the conductive interconnect members are disposed between the upper substrate layer 1209 and the lower substrate layer 1201.

FIG. 12d illustrates the resultant example releasable modular interconnect 1200 that is comprised of the upper substrate layer 1209, the conductive interconnect members 1202, and the lower substrate layer 1201. Each of the releasable contacts 1203 is positioned within a respective releasable contact region 1204 (e.g., releasable contact regions 1204d through 1204f). The releasable contact regions 1204 overlay an area where a terminal surface of a power cell would be positioned within an energy system. Via the releasable contacts 1203, the conductive interconnect members 1202 may be configured to form series or parallel electrical connections between power cells to generate a desired electrical configuration. The creation of apertures 1205 result in substrate tabs 1206 within each releasable contact region 1204 that facilitate movement of the releasable contacts 1203 affixed to the tab toward or away from the terminal of a power cell. Additionally, conductive interconnect members 1202a and 1202i include conductive portions configured as interconnect output terminals 1211a and 1211b. The interconnect output terminals 1211a and 1211b are preferably designed to form an electrical connection with bus members or energy system output terminals.

Figure 13:
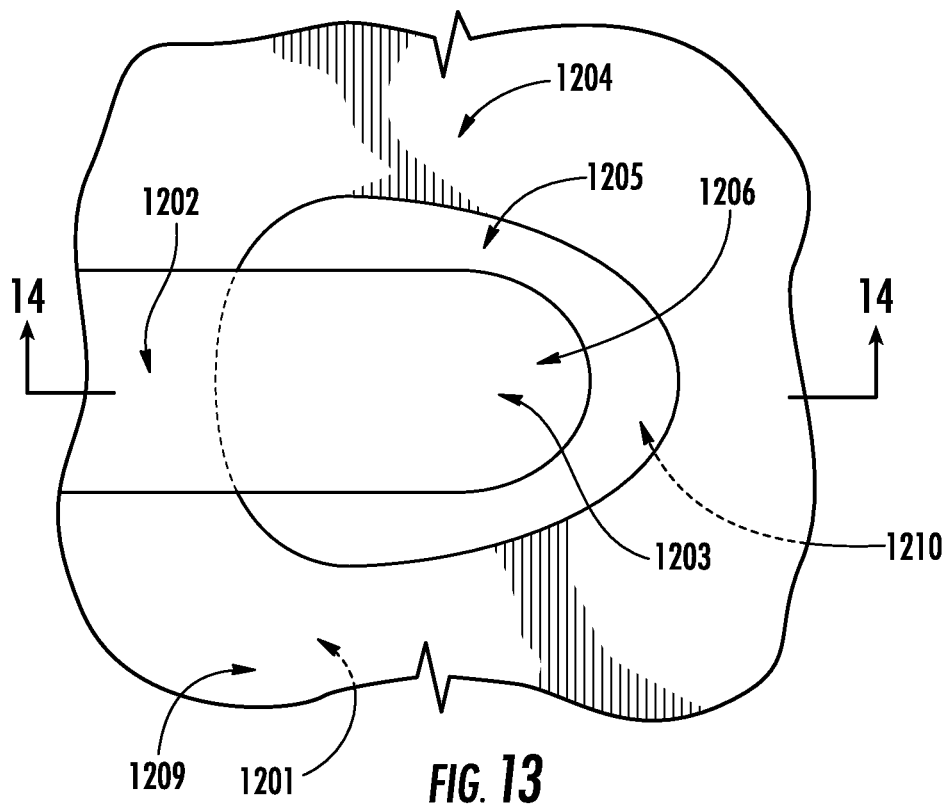
FIGS. 13 and 14 illustrate detailed representations of releasable contact regions of the releasable modular interconnect of FIG. 12d according to various example embodiments.
Figure 14:
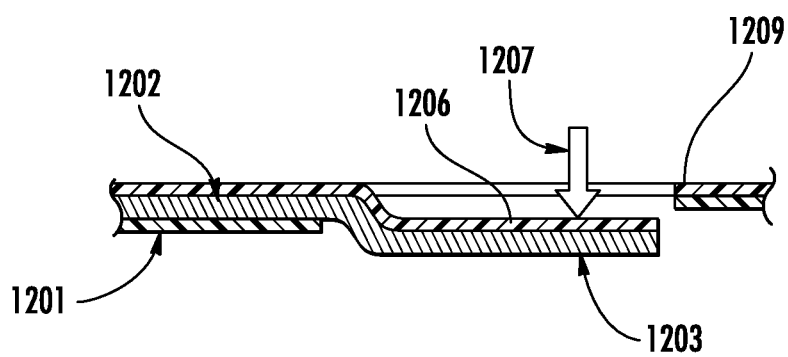

FIGS. 13 and 14 provide more detailed illustrations of an example releasable contact region 1204. Referring to FIG. 13, the releasable contact region 1204 includes a conductive interconnect member 1202 disposed between an upper substrate layer 1209 and a lower substrate layer 1201, a releasable contact 1203, an apertures 1205 and 1210, and a substrate tab 1206. As described above, aperture 1210 is an opening in the lower substrate layer 1201 that exposes the underside surface of the releasable contact 1203, and aperture 1205 is an opening in the upper substrate layer 1209 that results in the substrate tab 1206 affixed on a top surface of the releasable contact 1203. Alternatively, in some example embodiments, openings in both layers of the substrate may be created such that the releasable contact 1203 is exposed on both the top-side and under-side surfaces of the releasable contact 1203. By creating the apertures, substrate the tab 1206 and the releasable contact 1203 can be movably supported.

FIG. 14 illustrates the movable nature of the substrate tab 1206 and the releasable contact 1203 out of the planes of the substrate layers. In this regard, the substrate tab 1206 may be moveable, and may deflect into and out of a plane formed by the substrate, either above or below the planes formed by the substrate layers. FIG. 14 illustrates the substrate tab 1206 and the releasable contact 1203 after movement in response to a force 1207 being applied in the direction of the arrow. If a power cell were positioned below the releasable contact 1203, the releasable contact 1203 may form an electrical connection with a terminal of the power cell. Due to the flexibility of the substrate tab 1206 and the releasable contact 1203, the releasable contact 1203 is able to deflect as a result of the force 1207 from the plane of the substrate layers and flatten to form a high surface area connection to the terminal of a power cell.

The force 1207 may be generated in a variety of ways. In some example embodiments, a magnetic member may be affixed to the top-side substrate tab 1206 or the releasable contact 1203 to form a magnetic coupling, and thereby generate or contribute to the connection and holding force. In some example embodiments, the magnetic member may be selected or configured such that a magnitude of the magnetic field is function of a temperature of the magnetic member. In this regard, the magnetic member may be configured to magnetically couple with, for example, the power cell to contribute to a force applied to the releasable contact or the substrate tab that forms the releasable electrical connection, when the temperature of the magnetic member is less than a predetermined temperature. The predetermined temperature may be a Curie temperature of the magnetic member, and the predetermined temperature may be selected to be a maximum temperature for safe operation of the power cells. In this regard, the magnetic member may be proximate to the power cell to ensure that thermal energy generated by the power cell is received by the magnetic member. Additionally, or alternatively, the magnetic member may be positioned proximate to the electrical connection to receive ohmically generated heat. In some example embodiments, the predetermined temperature may also be selected based on the distance between the power cell and the magnetic member. According to some example embodiments, when the magnetic member reaches or exceeds the predetermined temperature, the magnetic member may lose magnetism and decouple from the power cell, thereby reducing a contribution to the force applied between the releasable contact and the terminal of the power cell, and, according to some example embodiments, preventing formation of the releasable connection. Alternatively, in some example embodiments, a pressure plate cushion may be placed on the releasable modular interconnect 1200 that includes pressure points that push on the substrate tabs to produce the connection and holding force and facilitate forming an electrical connection with terminals of the power cells.

Figure 15:
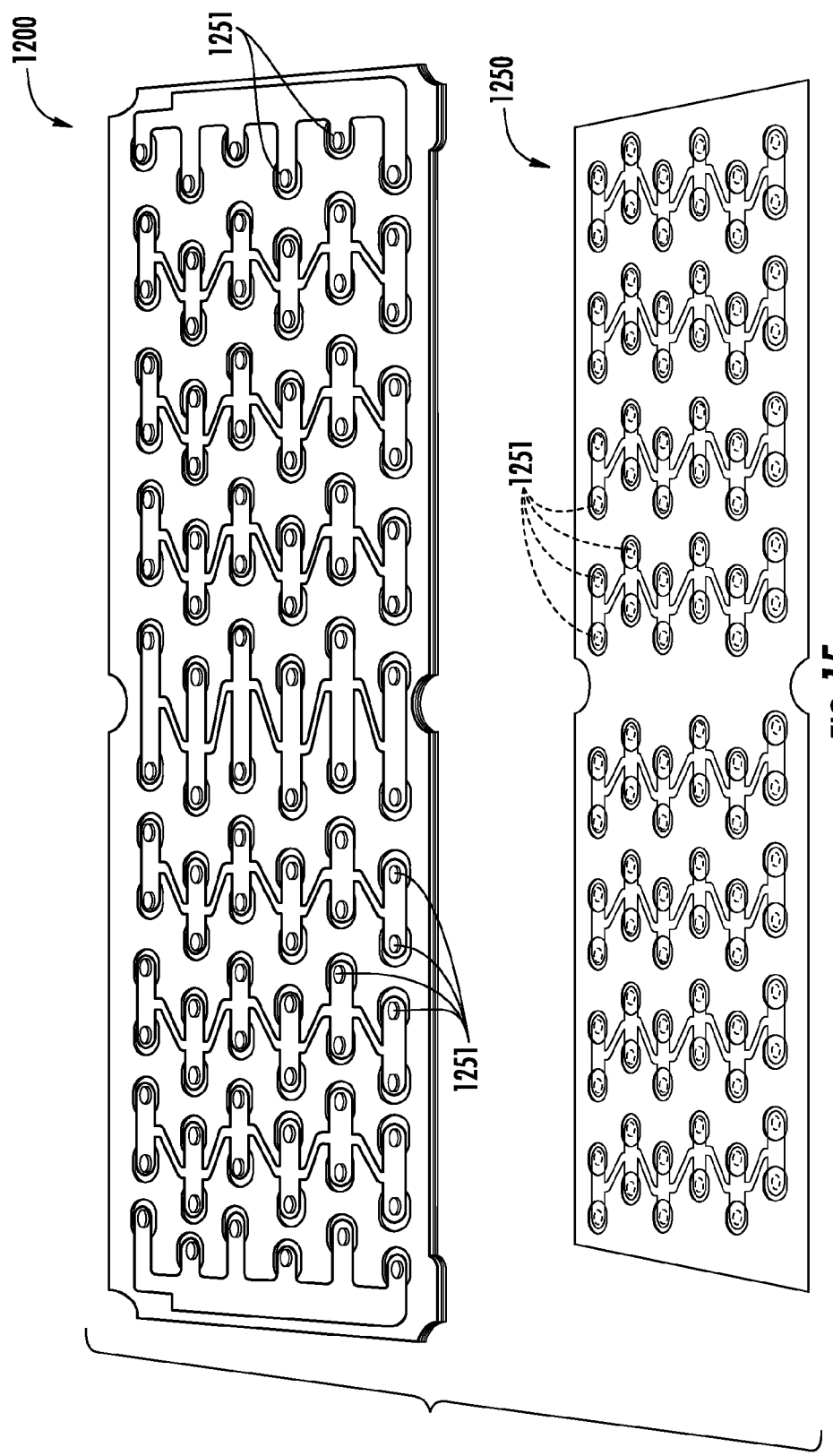
FIG. 15 illustrates the releasable modular interconnect of FIG. 12 with a complementary example releasable modular interconnect according to various example embodiments.

FIG. 15 illustrates releasable modular interconnect 1200 as an upper releasable modular interconnect for use with power cells having terminals on a bottom and top face. Releasable modular interconnect 1250 may be the lower releasable modular interconnect that complements the electrical connections formed by the upper releasable modular interconnect 1200 to form an electrical configuration of power cells. The upper and lower releasable modular interconnects 1200 and 1250 are depicted with magnetic members 1251 affixed to respective substrate tabs so as to magnetically couple with a power cell and form an electrical connection with the terminal of the power cell.

Figure 16:
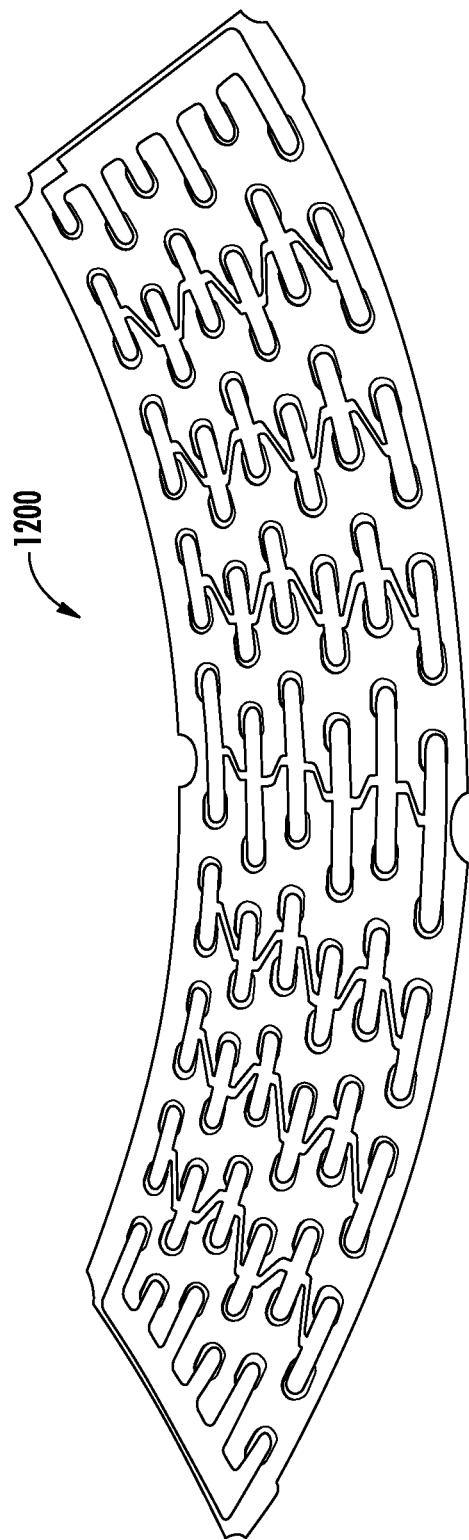
FIG. 16 illustrates a flexible embodiment of a releasable modular interconnect according to various example embodiments.

FIG. 16 illustrates the flexible nature of the releasable modular interconnect 1200. The flexibility of the releasable modular interconnect 1200 facilitates the forming of high quality electrical connections with the terminals of the power cells, because the releasable modular interconnect 1200 can deform under the forces applied to the releasable modular interconnect in a manner that provides for increased surface area interaction between the releasable contacts of the releasable modular interconnect and the terminals of the power cells. Additionally, the flexibility of the releasable modular interconnect 1200, according to some example embodiments, facilitates easy removal and replacement of the releasable modular interconnect within a housing of an energy system.

Figure 17A:
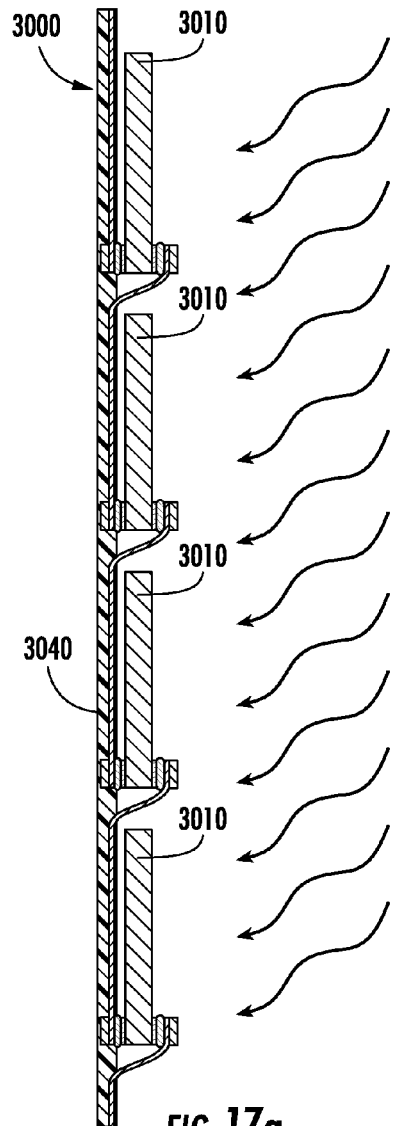
FIGS. 17a and 17b illustrate a releasable modular interconnect for use with an array of solar cells from a side view and a top view, respectively, according to various example embodiments.
Figure 18:
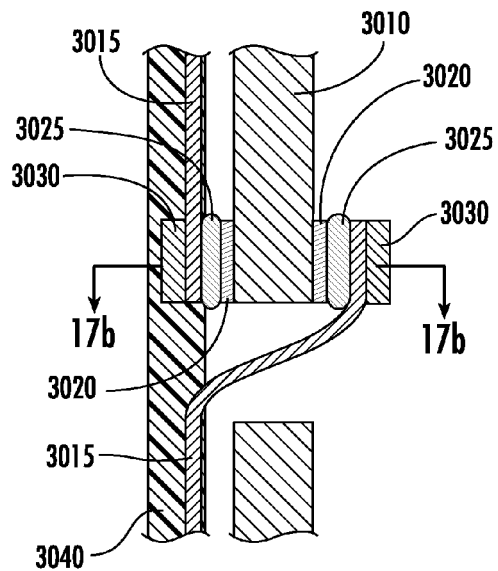
FIG. 18 illustrates a detailed view of a releasable contact region of a releasable modular interconnect configured for use with solar cells according to various example embodiments.
Figure 17B:
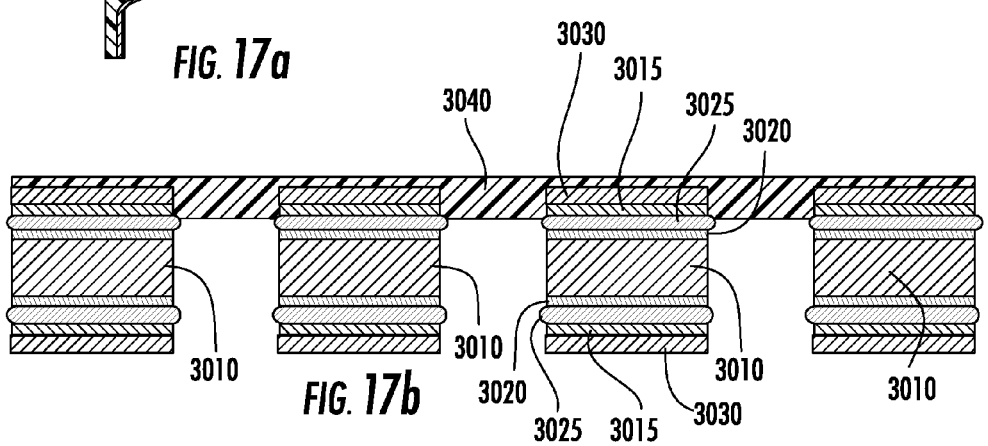

FIGS. 17a and 17b illustrate another releasable modular interconnect 3000 configured to generate an electrical configuration of solar cells 3010 within an array of solar cells. FIG. 17a depicts a side view of an array of solar cells that is four solar cells high. FIG. 17b depicts a cross-section of array of solar cells that is four solar cells wide. The solar cells 3010 may be photovoltaic cells. The solar cells 3010 may be electrically configured into a series connection via the releasable modular interconnect 3000. According to some example embodiments, a releasable modular interconnect may be designed that electrically connects some or all of the solar cells in series or in parallel. As depicted in the magnified view of a releasable contact region in FIG. 18, the releasable contacts 3015 of the releasable modular interconnect 3000 may be electrically connected, via releasable electrical connections to the terminals 3020 of the solar cells via a conductive paste 3025. In some example embodiments, the electrical connection may be formed without the conductive paste, for example, via a physical connection between the releasable contacts 3015 and the solar cell terminals 3020. The magnetic members 3030 may be configured to magnetically couple to the solar cell or the terminals of the solar cell to generate a connection force between the releasable contacts 3015 and the solar cell terminals 3020. According to some example embodiments, releasable contacts 3015 may be affixed to a substrate 3040. In some example embodiments, the magnetic members 3030 are affixed to the releasable contacts to facilitate a high quality electrical connection. In some example embodiments, the substrate 3040 and the releasable contacts 3015 may be flexible and may facilitate non-destructive repair and replacement of the solar cells, or replacement of the releasable modular interconnect 3000.

FIGS. 19a through 19l illustrate multiple example embodiments wherein magnetic coupling is used to attach a releasable modular interconnect releasable contact to a terminal of a power cell. The figures illustrate the manner in which a magnetic material (M) (which may be a magnetic member of a releasable modular interconnect or a power cell) and a conductor (C) (which may be a releasable contact of a releasable modular interconnect or a terminal of a power cell) may be arranged in relation to one another to form an open or closed releasable electrical connections. The example embodiments include ones that are based on magnetic attraction and ones that are based on magnetic repulsion. The magnetic attraction embodiments include an MCCM (sandwich) configuration and an MCMC (intercalated) configuration. The magnetic repulsion embodiments include an MMCC (unipolar) configuration. Suitable magnetic materials include, but are not limited to, ferromagnetic materials with or without a remnant field in place, ferrimagnetic materials with or without a remnant field in place, paramagnetic materials, or diamagnetic materials. According to some example embodiments, a conductor material may be the same material as a magnetic material. For example, a power cell encased in a steel case can have terminals that are both conductive (C) and ferromagnetic (M). Table 1 describes parameters associated with each style of connection.

TABLE 1

Connection Styles for Interconnect and Cell Releasable contact Regions

| | Style of Connection | | |
|---|---|---|---|
| | MCCM | MCMC | MMCC |
| Style Descriptor | Sandwich | Intercalated | Unipolar |
| Magnetic Force Sense, closed circuit | Attractive | Attractive | Repulsive |
| Magnetic Force Sense, open circuit | None | None | Attractive |
| Minimum Count of permanent magnets to close | 1 | 1 | 2 |
| Number of Permanent Magnets in nominal open configuration | 0 or 1 | 0 or 1 | 1 |
| Source of Force to open circuit | Mechanical | Mechanical | Magnetic |

To form or close an electrical connection, a magnetic field may be used to provide the compressive force that pushes together the two conductors and form a path for current. To break or open the electrical connection autonomously, one of the magnetic materials participating in the magnetic coupling that holds the conductors together may be heated to, or above, the magnetic materials' Curie temperature. Above the Curie temperature the material may no longer be responsive to an attractive or repulsive magnetic force exerted upon the material by the other participant in the magnetic coupling. Once cooled below the Curie temperature, the magnetic material, having lost its imprinted magnetic field will no longer be a magnet, although it will be attracted to a magnet. However, if a permanent magnet is used, the magnetic properties, but not the imprinted field, return after cooling. As an example, for a unipolar style connection, the closed state of the connection relies upon magnetic repulsion, as shown in FIG. 19i and FIG. 19j. After magnetic material 1420 has been heated to, or past, the Curie temperature for the magnetic material 1420, as shown by FIG. 19k, and then cools below the magnetic material 1420's Curie temperature, magnetic material 1420 may no longer possess an imprinted field repulsing the magnetic material 1410. While above its Curie temperature, the contact may open due to purely mechanical forces, such as supplied, for example, by a spring. As a result, a mechanical force, generated via for example a disconnect spring, causes the magnetic material 1420 to move towards magnet 1410 since the repulsive imprinted field of 1420 is gone. Once cooled below its Curie temperature, 1420 is again a magnetic material, but without its previously imprinted repulsive field. Yet the fundamental ferromagnetic or ferrimagnetic attraction to the imprinted field of 1410 remains, thus 1420 is magnetically pulled towards 1410 after cooling through its Curie temperature as shown in FIG. 19l. Thus 1420 transitions through a number of states where it is first ferro- or ferrimagnetic with imprinted field; then via heating 1420 becomes a paramagnetic material; and then via cooling 1420 becomes a ferro or ferri-magnetic material without imprinted field. With respect to the presence of forces, the states change from first being repulsive, to having no forces, to finally being attractive.

The magnetic material that undergoes a Curie temperature phase transition to actuate an open circuit condition may be positioned in an area expected to be in the path of the heat flux generated by a power cell, such as, for example, within the area of or affixed to a releasable contact or a terminal of a power cell. If the other magnetic material is a permanent magnet, preferably of higher Curie temperature, then sufficient force can be provided to pull the connection together (selectable by field strength and geometric factors) once the magnetic materials cool to below their Curie temperatures. Such a structure may oscillate if the heating continues. When the circuit is closed, heat may continue to flow from the cell or the releasable contact region into the magnetic material of lower Curie temperature, thereby raising the temperature of the magnetic material above the Curie temperature. The electrical connection may be broken by mechanical disconnect forces as the magnetic force fails, also reducing the flow of heat from the cell or releasable contact region to the first magnetic material. Once the magnetic material cools to below its Curie temperature, the magnetic material may again be attracted to the other magnetic material (which may be a permanent magnet to cause oscillation). The attractive forces may overcome the mechanical force that opened the circuit, and the circuit may be caused to close again. If the heating resumes, the cycle may repeat.

Figure 19A:
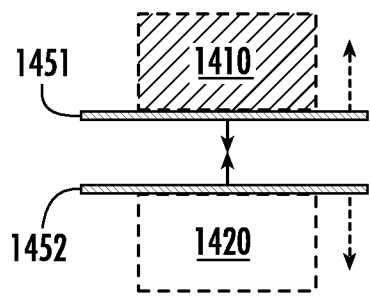

FIGS. 19a, 19b, 19c, and 19d illustrate an MCCM style or Sandwich style connection configuration in closed transition, closed, open transition, and open states, respectively. FIG. 19a is a schematic drawing of an MCCM or Sandwich style connection transitioning to a closed state. The magnetic material 1410 is depicted as a permanent magnet attached to conductor 1451, which may be a releasable contact of a releasable modular interconnect or a terminal of a power cell. The magnetic material 1420 may be a ferromagnetic or ferrimagnetic material attached to a conductor 1452, which may be a terminal of a power cell or releasable contact of a releasable modular interconnect. As such, due to the magnetic field of the magnetic material 1410, magnetic material 1410 may be attracted to magnetic material 1420 as indicated by the solid arrows. The dashed arrows indicate an external mechanical disconnect force generated by, for example, a spring or a disconnect magnetic force generated by other magnetic materials. In some example embodiments, magnetic material 1420 may possesses a remnant field (making it a permanent magnet).

Figure 19B:
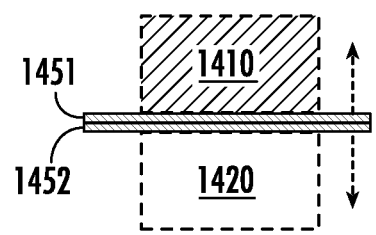
Figure 19C:
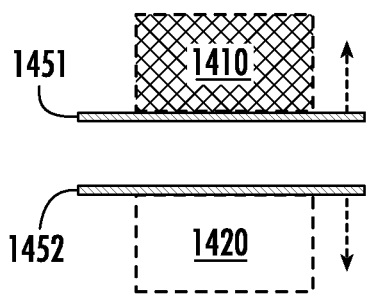
Figure 19D:
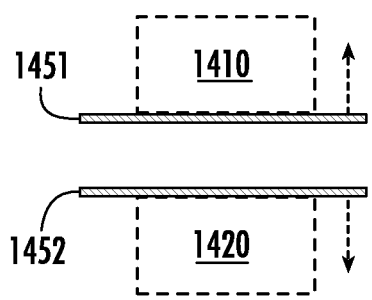

In FIG. 19b, the attractive forces of the magnetic field have overcome the mechanical disconnect forces to form an electrical connection. In FIG. 19c, the magnetic material 1410 has been heated to a temperature above its Curie temperature, possibly due to the heat generated by a failing power cell. As a result, the magnetic field previously generated by the magnetic material 1410 is reduced or eliminated, and the mechanical disconnect forces separate the conductors. In FIG. 19d, magnetic material 1410 is in a ferro- or ferrimagnetic state after cooling below its Curie temperature. Because of the heating, magnetic material 1410 no longer possesses a remnant field and is no longer operable to bring conductors 1451 and 1452 back into releasable contact with one another after being cooled. If magnetic materials 1410 and 1420 are both permanent magnets, and 1420 has not reached its Curie temperature, the magnetic attraction forces may be reestablished once the selected magnetic materials cool below their Curie temperature. As such, the electrical connection may be automatically reestablished.

Figure 19E:
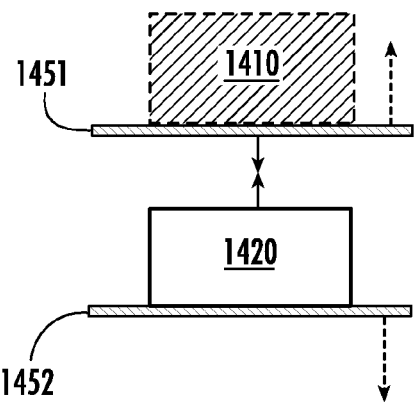

FIGS. 19e, 19f, 19g, and 19h illustrates an MCMC style or Intercalation style connection configuration in closed transition, closed, open transition, and open states, respectively. FIG. 19e is a schematic drawing of an MCMC or Intercalation style connection transitioning to a closed state. The magnetic material 1410 is depicted as a permanent magnet attached to conductor 1451, which may be a releasable contact of a releasable modular interconnect or a terminal of a power cell. The magnetic conductor 1420 may be a magnetic material attached to a conductor 1452, which may be a terminal of a power cell or releasable contact of a releasable modular interconnect. Magnetic material 1420, in FIGS. 19e through 19h may be a conductive material (as indicated by the depicted solid outline), as a result of an intrinsic property or due to a conductive coating. Due to the magnetic field of the magnetic material 1410, magnetic material 1410 may be attracted to magnetic material 1420 as indicated by the solid arrows. The dashed arrows indicate an external mechanical disconnect force generated by, for example, a spring. In some example embodiments, magnetic material 1420 may possesses a remnant field (making it a permanent magnet).

Figure 19F:
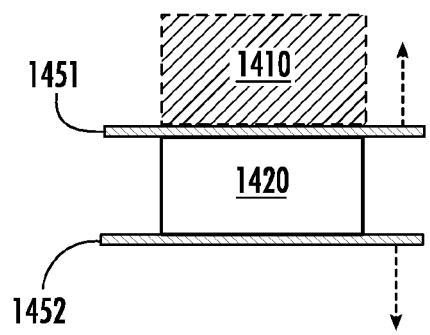
Figure 19G:
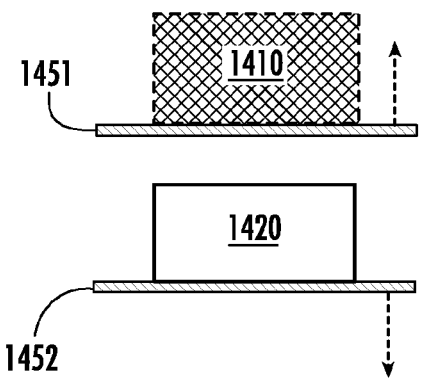
Figure 19H:
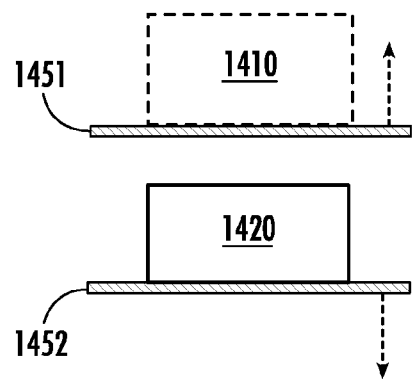

In FIG. 19f, the attractive forces of the magnetic field have overcome the mechanical disconnect forces to form an electrical connection. In FIG. 19g, the magnetic material 1410 has been heated, possibly due to ohmic heating from current flowing through the electrical connection, to a temperature above its Curie temperature, possibly due to the heat generated by a failing power cell. As a result, the magnetic field previously generated by the magnetic material 1410 is reduced or eliminated, and the mechanical disconnect forces separate the conductors. In FIG. 19h, magnetic material 1410 is in a ferro- or ferrimagnetic state after cooling below its Curie temperature. Because of the heating, magnetic material 1410 no longer possesses a remnant field and is no longer operable to bring conductors 1451 and 1452 back into releasable contact with one another after cooling. If magnetic materials 1410 and 1420 are both permanent magnets, and either 1420 has a higher Curie temperature than 1410 or 1420 does not receive enough heating to reach its Curie temperature, the magnetic attraction forces may be reestablished once the selected magnetic materials cool below their Curie temperature. As such, the electrical connection may be automatically reestablished.

The unipolar style uses magnetic repulsion as the force operable to connect two conductors and is capable of operating in an autonomously reversible fashion when a permanent magnet is attached to, or integral to, the two conductors of the releasable contact. FIGS. 19i, 19j, 19k, and 19l illustrate an MMCC style or Unipolar connection configuration in closed transition, closed, open transition, and open states, respectively. FIG. 19i is a schematic drawing of an MMCC or Unipolar style connection transitioning to a closed state. The magnetic material 1410 is a permanent magnet attached to a mechanical support 1441. The magnetic material 1420 also is a permanent magnet attached to conductor 1451, which may be a releasable contact of a releasable modular interconnect or a terminal of a power cell. Conductor 1452, which may be a terminal of a power cell or releasable contact of a releasable modular interconnect, may be connected to a mechanical support 1442. As such, due to the magnetic field of the magnetic materials 1410 and 1420, magnetic material 1410 may be repulsed (same polarities being proximate) from magnetic material 1420 as indicated by the solid arrows. The dashed arrows indicate an external mechanical disconnect force generated by, for example, a spring.

In FIG. 19j, the repulsive forces of the magnetic field have overcome the mechanical disconnect forces to form an electrical connection. In FIG. 19k, the magnetic material 1420 has been heated to a temperature above its Curie temperature, possibly due to the heat generated by a failing power cell. As a result, the magnetic field previously generated by the magnetic material 1410 is reduced or eliminated, and the mechanical disconnect forces separate the conductors. In FIG. 19l, magnetic material 1420 is in a ferro- or ferrimagnetic state after cooling below its Curie temperature. Because of the heating, magnetic material 1420 no longer possesses a remnant field and is no longer operable to bring conductors 1451 and 1452 back into releasable contact with one another.

Instead, magnetic material 1420 will be attracted to magnetic material 1410, and hold the conductors apart until a new magnetic material is put in place or the existing one is remagnetized.

Magnetic material 1410 of MCCM and MCMC connections and 1420 of MMCC connections may reside on an upper or lower surface of a flexible conductor. Alternatively, a magnetic material 1420 may be on a lower surface of a conductor. Magnetic material 1410 or 1420 may be nickel plated onto copper conductor 1451 or 1452, for tabbed prismatics, or a steel layer underneath plating, or bare steel, that makes up the can of a cell. In some embodiments, a configuration utilizes a pair of magnetic materials, where, for example, at least one of which is carrying an imprinted magnetic field that will hold the electrical releasable contacts together in a reversible fashion. The magnetic materials could theoretically be pole pieces of an electromagnet, or in some cases flux concentrating structures that work with ambient fields. Alternatively, an electromechanical relay may be used. Additional features that may be added include magnetic materials with a Curie temperature that results in a loss of coupling force when the surrounding temperature rises to the material's Curie temperature. Additionally, a fluidic conductive interface material, for example a conductive paste may be inserted between the opposed electrical releasable contacts to generate a low current density, high surface area, and high quality, electrical releasable contact. A fluidic conductive interface material may be a silicone or other polymeric material (such as a conductive grease) or a liquid metal (such as mercury). Separation of the conductors can be accomplished through spring forces, or a third magnetic material that may draw the remaining magnetic material in such a direction as to open the connection.

Additionally, a mechanical force, for example a weak spring, strong enough to pull the connection open, but not strong enough to force the connection open below a certain temperature/magnetic strength of material, may be used to separate the releasable contacts. Forcing the releasable contacts open need not be essential. In some example embodiments, the magnetic materials may be used with a static interconnection that is not self-actuated. According to some example embodiments, safety from thermal runaway may be achieved via implementation of the magnetic materials.

Figure 20:
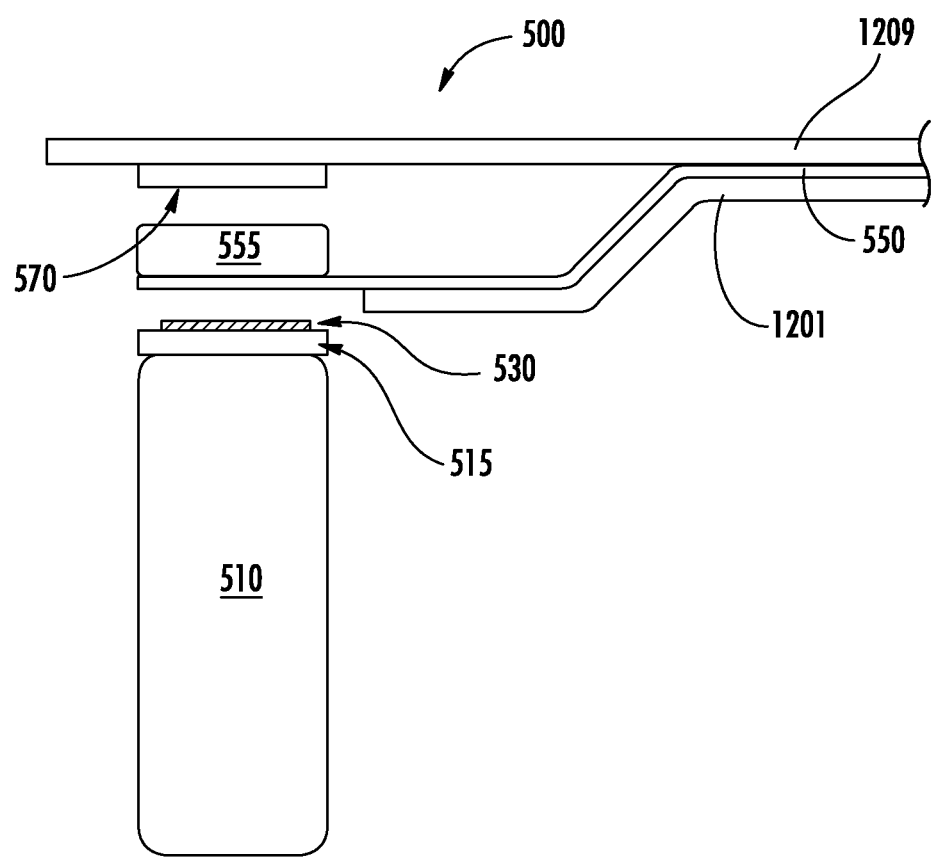
FIGS. 20-22 illustrate the a releasable power cell contact apparatus for use in a releasable modular interconnect according to various example embodiments.

Based on the techniques described with respect to FIGS. 19*a* through 19*l*, releasable power cell contact apparatuses for use with a releasable modular interconnect can be described. FIGS. 20 through 24 describe the structure and operation of releasable power cell contact apparatuses 500, 800, and 900. The releasable power cell contact apparatuses may be part of a releasable modular interconnect, and thereby included in a multi-cell housing comprising, for example, a plurality of power cells. The releasable power cell contact apparatus may be positioned in a releasable contact region as described with respect to, for example, FIG. 12*d*. The releasable power cell contact apparatus may also be detachable, for example, with a releasable modular interconnect, from the multi-cell housing, without removing any one of the power cells. FIG. 20 illustrates a releasable power cell contact apparatus 500 in an open circuit position with a power cell 510. Releasable power cell contact apparatus 500 may include magnetic members 555 and 570, a conductive paste 530, and a releasable contact 550. The releasable contact 550 may be disposed between layers of a substrate that includes an upper layer 1209 and a lower layer 1201. In some example embodiments, the upper layer 1209 may be rigid, while the lower layer 1201 may be flexible. According to some example embodiments, the power cell 510 may include a magnetic member 515, which may be imprinted with a magnetic field, and may be comprised of a ferromagnetic, ferrimagnetic, or paramagnetic material. The exterior case of the power cell 510 may be nickel plated steel or another magnetic material.

Magnetic member 555, which may be a permanent magnet (e.g., ferromagnet or ferrimagnet), may be configured to generate a magnetic field for forming an electric connection between the terminal of the power cell 510 and the releasable contact 550 by applying a force to the releasable contact 550 via magnetic coupling between the magnetic member 555 and the power cell 510. In some example embodiments, the magnitude of the magnetic field generated by the magnetic member 555 may be a function of a temperature of the magnetic member. The magnetic member 555 may be affixed to the releasable contact 550 and positioned to generate magnetic coupling with the power cell (e.g., magnetic member 515) to thereby apply a connection force to the releasable contact 550. In some example embodiments, the releasable power cell contact apparatus 500 may include magnetic member 570, which may be a disconnect magnetic member configured to maintain an open circuit condition when magnetic member 555 is heated past its Curie temperature and subsequently cools. According to some example embodiments, if magnetic member 515 is a permanent magnet, magnetic member 555 may be comprised of a magnetic material, but need not be a permanent magnet.

Magnetic member 570 may be a permanent magnet, for example a ferromagnet or a ferrimagnet. The magnetic member 570 may be configured to generate a disconnect force on the releasable contact 550 that is oriented away from the terminal of the power cell. The magnetic field generated by the magnetic member 570 may also be a function of temperature. In this regard, due to the temperature response of the magnetic member 555, the magnetic force generated by the magnetic members 555 and 570 may be a function of the temperature of the magnetic member 570, the temperature of the magnetic member 555, or the temperature of both. According to some example embodiments, substrate layer 1209 may be configured to facilitate the operation of the magnetic member 550, and possibly a disconnect spring physically connected between the substrate layer 1209 and the releasable contact 550 that contributes to a disconnect force.

Releasable contact 550 may be comprised of a flexible material and movably supported to facilitate movement of the releasable contact toward the terminal of the power cell 510 to form an electrical connection with the terminal when a force is applied to the releasable contact 550 toward the terminal. The releasable contact 550 may also be movably supported to facilitate movement away from the terminal of the power cell 510 to prevent an electrical connection with the terminal. In some example embodiments, the releasable contact 550 may be under mechanical tension to oppose the attractive magnetic forces generated between magnetic members 555 and 515. The mechanical disconnect forces generated, for example, by the tension of the releasable contact 550 and, for example, the disconnect spring 540 may be less than the attractive magnetic forces that may be generated by the magnetic members 555 and 515.

Figure 21:
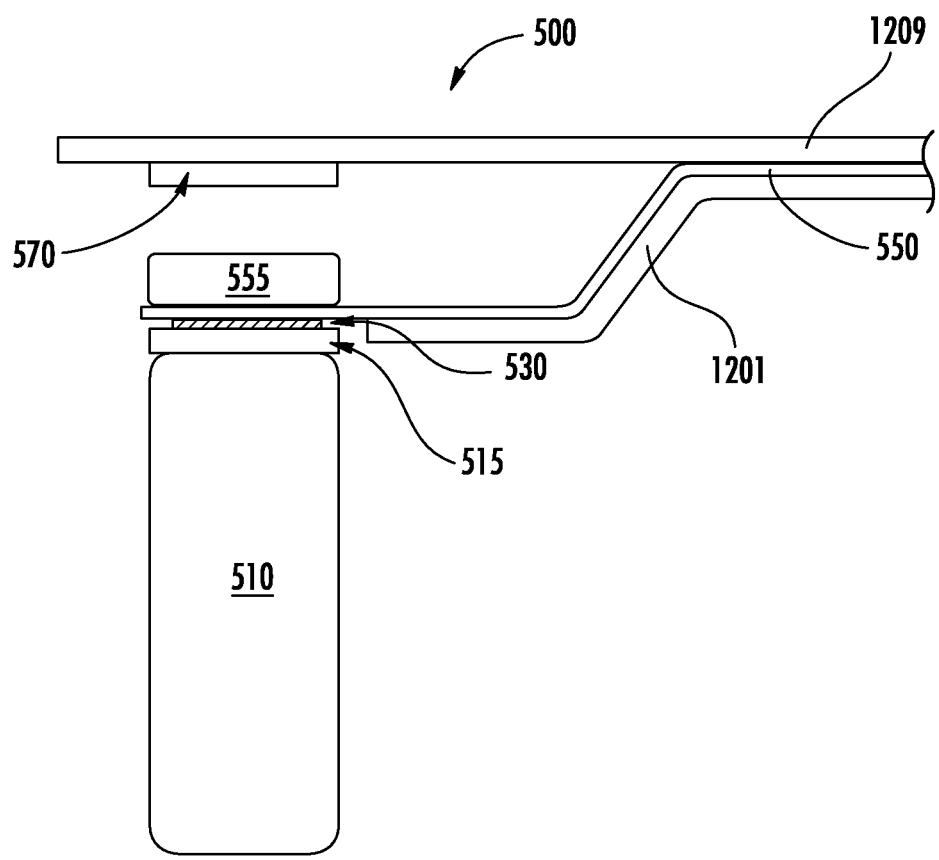

With respect to the operation of the releasable power cell contact apparatus 500, when the temperature of the magnetic member 555 is below its Curie temperature, the magnetic member 555 may magnetically couple with the magnetic member 515 of the power cell. As a result of the magnetic coupling, an attractive force between the magnetic member 555 and the magnetic member 515 may be generated. Since the magnetic member 555 is affixed to the releasable contact 550, the attraction force can operate to move the releasable contact 550 towards the terminal of the power cell 510. The releasable contact 550 can move towards the terminal of the power cell 510, when the attractive force is greater than the disconnect force, which may be generated by a combination of the tension in the releasable contact 550, the force applied by a disconnect spring, or any magnetic coupling that is generated between the magnetic member 570 and the magnetic member 555. FIG. 21 illustrates the state of the cell connection apparatus 500, when the temperature of the magnetic member 555 is less than the Curie temperature for the magnetic member 555 and a releasable electrical connection to the terminal of the power cell 510 has been formed. In some instances, as the current flow through the electrical connection between the terminal of the power cell 510 and the contact 550 increases, the ohmic heating of the electrical connection can increase. As a result, the ohmic heating of the electrical connection can provide an indication of the current that is flowing through the electrical connection. The ohmic heating in the electrical connection can also contribute to the heat received by the magnetic member 555 to bring the temperature of the magnetic member closer to the magnetic member's Curie temperature.

Figure 22:
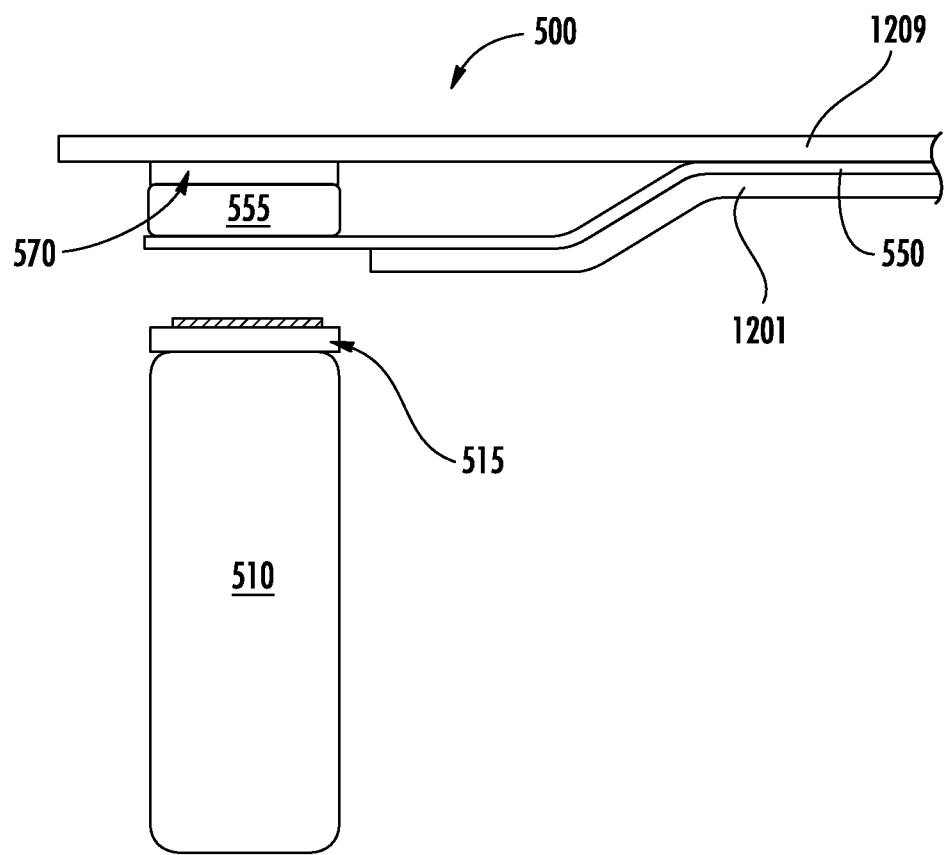

The Curie temperature characteristic of the magnetic member 555 may be selected such that when the power cell reaches an unsafe or imminent cell failure temperature level or the current through the electrical connection exceeds a threshold value as indicated by ohmic heating, the magnetic field of the magnetic member 555 will be reduced, and decoupling may occur to a point that the disconnect force overcomes the magnetic coupling between the magnetic member 555 and the magnetic member 515 to move the releasable contact 550 and break the releasable electrical connection. According to some example embodiments, the temperature where a disconnection is desired may be predetermined based on a number of factors including the magnetic member's proximity to the power cell 510 or other heat transfer criteria. Further, according to some example embodiments, because the ohmic heating of an electrical connection is related to the current flowing through the connection, the temperature for disconnection may be selected such that overcurrent conditions may be responded to by the operation of the magnetic member. FIG. 22 illustrates the state of the cell connection apparatus 500, when the temperature of the magnetic member 555 has reached or exceeded the Curie temperature. In this regard, due to the reduced magnetic field, the releasable contact 550 has disconnected from, and moved away from, the terminal of the power cell 510. As a result of the movement of the releasable contact 550, the magnetic member comes into closer proximity with the magnetic member 570. Magnetic coupling between the magnetic member 555 and 570 may cause the releasable contact to stay held in an open circuit position, until manually reset.

According to various example embodiments, if the magnetic member is a permanent magnet, when the magnetic member 555 cools, the magnetic properties may return, resulting in an attraction to the permanent magnet member 570, and a connection force may be generated and hold the releaseable contact in an open circuit position. If the magnetic member 555 was previously imprinted with the magnetic field (permanent magnet), then the magnetic field may not return to the magnetic member and the releasable contact may remain in an open circuit position.

Figure 23:
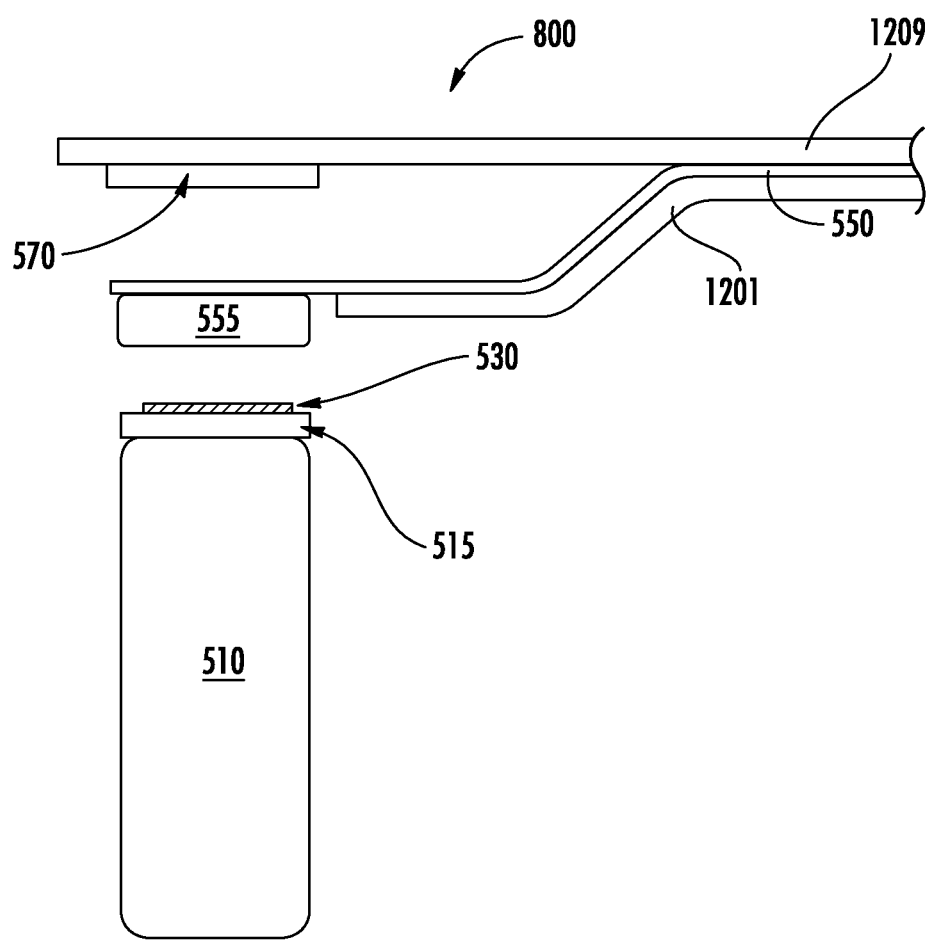
FIGS. 23 and 24 illustrate additional example releasable power cell contact apparatuses for use in a releasable modular interconnect according to various example embodiments.

FIG. 23 illustrates another example releasable power cell contact apparatus 800. Contrasting with the example releasable power cell contact apparatus 500, the releasable power cell contact apparatus 800 includes magnetic member 555 positioned between the releasable contact 550 and the power cell terminal 515. In this regard, magnetic member 555 may operate in the same manner, as described with respect to FIGS. 20 through 22, however, magnetic member 555 may include or be coated in a conductive material, thereby making the magnetic member part of the releasable contact 550 and part of the current path formed by the releasable electrical connection. In some embodiments heating of the magnetic member 555 may be generated by current flowing through, for example, a conductive layer encasing magnetic member 555. In this regard, the conductive layer may be of a thickness and resistivity such that, at a predetermined current, sufficient resistive heat is generated to increase the temperature of magnetic member 555 above its Curie temperature thereby causing the releasable contact 550 to disconnect. In some example embodiments, magnetic member 555 may intrinsically be a conductor and does not require an additional conductive coating or conductive layer.

Figure 24:
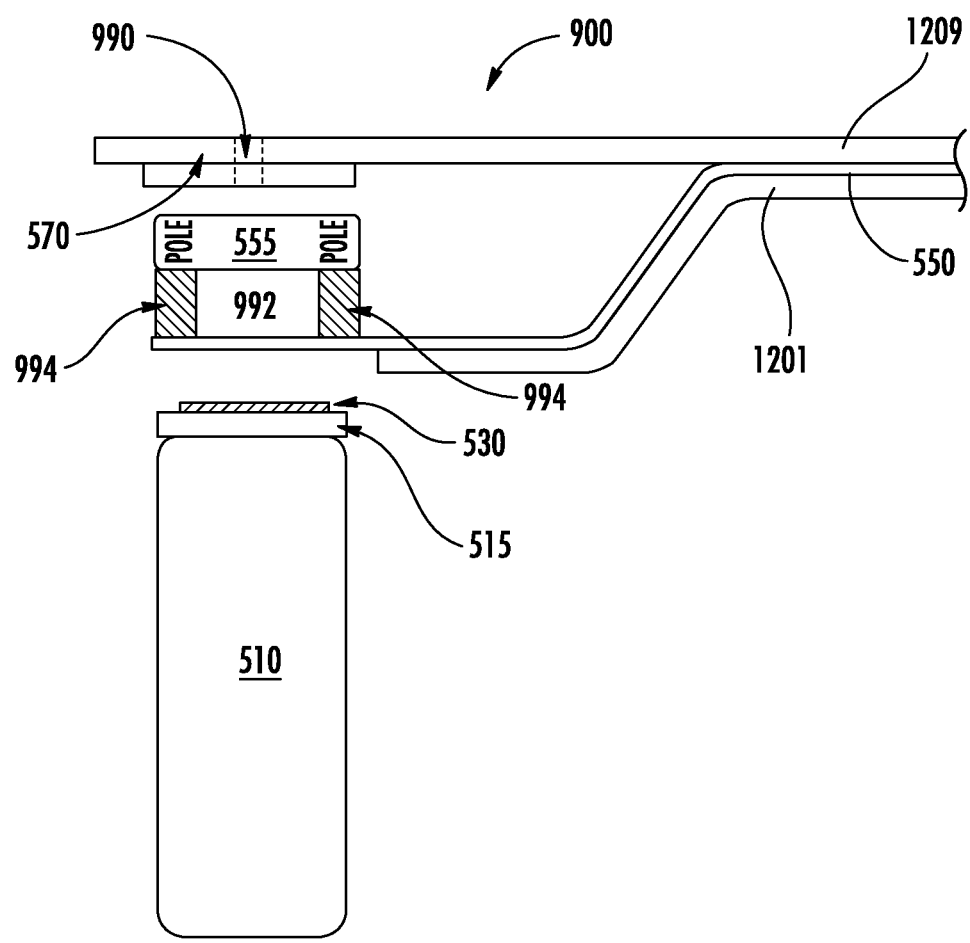

FIG. 24 illustrates another releasable power cell contact apparatus 900 in an open circuit position. Releasable power cell contact apparatus 900 includes the components of releasable power cell contact apparatus 500, as well as, a reset passage 990, an air gap 992, and magnetic pole pieces 994. A magnetic circuit for the releasable power cell contact apparatus 900 comprises a magnetic member 555 (e.g., a permanent magnet), pole pieces 994, and magnetic member 515. Magnetic member 515 may magnetically couple with magnetic member 555 to form the electrical connection, as indicated by a closed circuit position. For the open circuit position, the magnetic field and resultant force may be based on the magnetic coupling formed by the magnetic member 570. Reset passage 990 may be a hole through upper substrate layer 1209 for a push rod or other implement to reset electrical releasable contact from an open to a closed position. Air gap 992 is positioned between magnetic members 994, which are pole pieces with selected Curie temperatures near a maximum safe operating temperature of a cell. Exemplary materials for embodying pole pieces 994 include gadolinium, manganese arsenide, or the like. Reset passage 990 may be operable to mechanically reset the connection by a push rod or other implement traveling through opening 990 for this purpose.

In some of the example self-actuating embodiments described above, at least one of the magnetic members used for magnetic coupling that actuates the releasable contacts may be selected to have a Curie temperature suitably near the safe upper operating temperature for the cells to which a releasable connection is made. When a cell reaches a temperature at or above the Curie temperature of the magnetic material, the magnetic material may undergo a change to a paramagnetic state and the magnetic force holding the releasable modular interconnect in releasable contact with a cell releasable contact region may be removed or at least diminished. As a result, a releasable modular interconnect including the releasable power cell contact apparatus may be utilized as an active circuit element, rather than a passive element. Further, the reduction or removal of a magnetic force keeping the releasable modular interconnect in releasable contact with the cell's terminal may assist with preventing the transfer of heat from an overheating cell to neighboring cells, thereby preventing a runaway cascade of thermal failure. Removing an overheating cell from the circuit can interrupt the rising temperature. As a result, safety may be further enforced via disconnection, which operates to minimize potential damage to otherwise well-functioning neighboring cells and preserving an overall high utility of the entire system. The selection of magnetic materials based on Curie temperature can therefore allow flexibility to use current cell technologies, as well as accommodate future technologies, with different safe operating temperature ranges.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements or functions, it should be appreciated that different combinations of elements or functions may be provided by alternative embodiments without departing from the scope of the appended claims. In this regard, for example, different combinations of elements or functions other than those explicitly described above are also contemplated as may be set forth in some of the appended claims. Although specific terms are employed herein, they are used in a generic and descriptive sense only and not for purposes of limitation.

What is claimed is:

1. A releasable power cell interconnect comprising:
   a substrate comprising a plurality of releasable contact regions, each releasable contact region being positioned to overlay a respective terminal of a power cell; and
   at least a first conductive interconnect member affixed to the substrate, the first conductive interconnect member comprising at least a first conductive releasable contact disposed within a first releasable contact region of the substrate, the first conductive releasable contact being positioned to form a releasable electrical connection with a terminal of a first power cell when a force is applied to the first releasable contact region in a direction toward the terminal of the first power cell, wherein the substrate is flexible; and
   a magnetic member configured to generate a magnetic force that is a function of temperature and configured to magnetically couple with the first power cell to contribute to at least a portion of the force applied to the first releasable contact region that forms the releasable electrical connection.

2. The releasable power cell interconnect of claim 1, wherein the first conductive interconnect member is comprised of a conductive foil.

3. The releasable power cell interconnect of claim 1, wherein the magnetic member is affixed to the first releasable contact region.

4. The releasable power cell interconnect of claim 1, wherein the magnetic member is configured to magnetically couple with the first power cell to contribute to the force applied to the first releasable contact region that forms the releasable electrical connection when the temperature of the magnetic member is less than a predetermined temperature.

5. The releasable power cell interconnect of claim 1, wherein the magnetic member is configured to magnetically decouple from the first power cell to reduce a contribution to the force applied to the first releasable contact region and thereby prevent a formation of the releasable electrical connection with the terminal of the first power cell when the temperature of the magnetic member is greater than a predetermined temperature.

6. The releasable power cell interconnect of claim 1, further comprising a conductive paste disposed between the first conductive releasable contact and the terminal of first power cell, the conductive paste being configured to facilitate a forming of the releasable electrical connection.

7. The releasable power cell interconnect of claim 1, wherein each releasable contact region of the substrate is comprised of a tab formed by an aperture in the substrate, the tab being movably supported by the substrate along at least one edge to facilitate movement of the tab towards or away from the respective terminal of a power cell.

8. The releasable power cell interconnect of claim 1, wherein the first conductive interconnect member affixed to the substrate comprises a second conductive releasable contact electrically connected to the first conductive releasable contact, the second conductive releasable contact being disposed within a second releasable contact region of the substrate and positioned to form a releasable electrical connection with a terminal of a second power cell when a force is applied to the second releasable contact region in a direction toward the terminal of the second power cell,
   wherein the first conductive interconnect member is configured to form a parallel or series electrical connection between the terminal of the first power cell and the terminal of the second power cell via the releasable electrical connection with the terminal of the first power cell and the releasable electrical connection with the terminal of the second power cell.

9. A releasable power cell contact apparatus comprising:
   a substrate including a releasable contact region being positioned to overlay a terminal of a power cell;
   a conductive releasable contact movably supported to the substrate to facilitate movement of the conductive releasable contact toward the terminal of the power cell to form an electrical connection with the terminal when a connection force is applied to the conductive releasable contact toward the terminal, or to facilitate movement of the conductive releasable contact away from the terminal to prevent the electrical connection with the terminal, wherein substrate is flexible; and
   a magnetic member configured to generate a magnetic field, a magnitude of the magnetic field being a function of a temperature of the magnetic member, the magnetic member being affixed to the conductive releasable contact and positioned to form magnetic coupling with the power cell to thereby apply the connection force to the conductive releasable contact.

10. The releasable power cell contact apparatus of claim 9, wherein the magnetic member is configured to reduce the magnitude of the magnetic field to facilitate movement of the conductive releasable contact away from the terminal of the power cell when the magnetic member reaches a predetermined temperature.

11. The releasable power cell contact apparatus of claim 9, wherein the magnetic member is configured to reduce the magnitude of the magnetic field to facilitate movement of the conductive releasable contact away from the terminal of the power cell when the magnetic member reaches a selected Curie temperature.

12. The releasable power cell contact apparatus of claim 9, wherein the magnetic member is further positioned proximate the power cell to receive thermal energy from the power cell.

13. The releasable power cell contact apparatus of claim 9, wherein the releasable power cell contact apparatus is included within a multi-cell housing comprising a plurality of power cells, and wherein the releasable power cell contact apparatus is detachable from the multi-cell housing.

14. The releasable power cell contact apparatus of claim 9, wherein the releasable power cell contact apparatus is included within a multi-cell housing comprising a plurality of power cells, and wherein the releasable power cell contact apparatus is removable from the multi-cell housing without removal of any one of the plurality of power cells.

15. The releasable power cell contact apparatus of claim 9, further comprising a conductive paste disposed between the conductive releasable contact and the terminal of the power cell, wherein the conductive paste is configured to facilitate the electrical connection with the terminal of the power cell.

16. The releasable power cell contact apparatus of claim 9, further comprising a disconnect spring configured to generate a disconnect force on the conductive releasable contact oriented away from the terminal of the power cell.

17. The releasable power cell contact apparatus of claim 9, further comprising a disconnect magnet configured to generate a disconnect force on the conductive releasable contact oriented away from the terminal of the power cell.

18. The releasable power cell contact apparatus of claim 9, wherein the conductive releasable contact includes conductive material disposed within the magnetic member, and wherein the magnetic member is positioned between the conductive releasable contact and the terminal of the power cell.

19. The releasable power cell contact apparatus of claim 9, further comprising a reset passage configured to receive a reset member that applies a force on the conductive releasable contact toward the terminal of the power cell to overcome forces oriented away from terminal of the power cell to establish the electrical connection between the conductive releasable contact and the terminal of the power cell.

20. A releasable power cell contact apparatus comprising:
a substrate including a releasable contact region being positioned to overlay a terminal of a power cell;
a conductive releasable contact movably supported to the substrate to facilitate movement of the conductive releasable contact toward the terminal of the power cell to form an electrical connection with the terminal when a connection force is applied to the conductive releasable contact toward the terminal, or to facilitate movement of the conductive releasable contact away from the terminal to prevent the electrical connection with the terminal, wherein the substrate is flexible; and
a magnetic member affixed to the conductive releasable contact and positioned to form magnetic coupling with the power cell to thereby apply the connection force to the conductive releasable contact via a magnetic field generated by the magnetic member, the magnetic field being a function of temperature.

21. The releasable power cell contact apparatus of claim 20, wherein the releasable power cell contact apparatus is included within a multi-cell housing comprising a plurality of power cells, and wherein the releasable power cell contact apparatus is detachable from the multi-cell housing.

22. The releasable power cell contact apparatus of claim 20, wherein the releasable power cell contact apparatus is included within a multi-cell housing comprising a plurality of power cells, and wherein the releasable power cell contact apparatus is removable from the multi-cell housing without removal of any one of the plurality of power cells.

23. The releasable power cell contact apparatus of claim 20, further comprising a conductive paste disposed between the conductive releasable contact and the terminal of the power cell, wherein the conductive paste is configured to facilitate the electrical connection with the terminal of the power cell.

24. The releasable power cell contact apparatus of claim 20, further comprising a disconnect spring configured to generate a disconnect force on the conductive releasable contact oriented away from the terminal of the power cell.

25. The releasable power cell contact apparatus of claim 20, further comprising a disconnect magnet configured to generate a disconnect force on the conductive releasable contact oriented away from the terminal of the power cell.

26. The releasable power cell contact apparatus of claim 20, wherein the conductive releasable contact includes conductive material disposed within the magnetic member, and wherein the magnetic member is positioned between the conductive releasable contact and the terminal of the power cell.

27. The releasable power cell contact apparatus of claim 20, further comprising a reset passage configured to receive a reset member that applies a force on the conductive releasable contact toward the terminal of the power cell to overcome forces oriented away from the terminal of the power cell to establish the electrical connection between the conductive releasable contact and the terminal of the power cell.

* * * * *